(12) United States Patent
An et al.

(10) Patent No.: US 12,041,832 B2
(45) Date of Patent: *Jul. 16, 2024

(54) DISPLAY DEVICE HAVING INTERSECTING INITIALIZATION POWER LINE PORTIONS

(71) Applicant: Samsung Display Co., Ltd., Yongin-si (KR)

(72) Inventors: Jun Yong An, Yongin-si (KR); Yun Kyeong In, Yongin-si (KR); Jun Won Choi, Yongin-si (KR); Won Mi Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,603

(22) Filed: Dec. 25, 2022

(65) Prior Publication Data

US 2023/0136961 A1    May 4, 2023

Related U.S. Application Data

(63) Continuation of application No. 16/871,505, filed on May 11, 2020, now Pat. No. 11,569,339, which is a
(Continued)

(30) Foreign Application Priority Data

Dec. 30, 2016    (KR) .................. 10-2016-0183421

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/1216* (2023.02);
(Continued)

(58) Field of Classification Search
CPC ........... H10K 59/1315; H10K 59/1213; H10K 59/1216; H10K 59/124; H10K 59/131;
(Continued)

(56) References Cited

U.S. PATENT DOCUMENTS 6,900,470 B2    5/2005    Kobayashi et al.
7,696,518 B2    4/2010    Koo
(Continued)

FOREIGN PATENT DOCUMENTS

CN    1541039    10/2004
CN    103794175    5/2014
(Continued)

OTHER PUBLICATIONS

Non-Final Office Action dated Jan. 24, 2019, in U.S. Appl. No. 15/844,645.
(Continued)

*Primary Examiner* — Nduka E Ojeh
*Assistant Examiner* — Laura M Dykes
(74) *Attorney, Agent, or Firm* — KILE PARK REED & HOUTTEMAN PLLC

(57) ABSTRACT

A display device may includes: a substrate including a pixel area and a peripheral area; pixels provided in the pixel area of the substrate, each of the pixels including a light-emitting element provided with a pixel electrode; scan lines and data lines coupled to the pixels; a power line configured to supply driving power to the light-emitting elements, and extending in one direction; and an initialization power line configured to supply initialization power to the light-emitting elements. The power line and the initialization power line may be provided on different layers. The initialization power line may include: first conductive lines extending in a direction oblique to the scan lines and the data lines; and conductive lines intersecting the first conductive lines. The first and
(Continued)

second conductive lines may be disposed in areas between the pixel electrodes of adjacent light-emitting elements.

5 Claims, 14 Drawing Sheets

Related U.S. Application Data continuation of application No. 15/844,645, filed on Dec. 18, 2017, now Pat. No. 10,651,264.

(51) Int. Cl.
  *H10K 59/124* (2023.01)
  *H01L 27/12* (2006.01)
  *H10K 59/35* (2023.01)

(52) U.S. Cl.
  CPC ......... *H10K 59/124* (2023.02); *H10K 59/131* (2023.02); *H01L 27/124* (2013.01); *H01L 27/1248* (2013.01); *H10K 59/121* (2023.02); *H10K 59/352* (2023.02); *H10K 59/353* (2023.02)

(58) Field of Classification Search
  CPC .. H10K 59/121; H10K 59/352; H10K 59/353; H10K 59/123; H01L 27/124; H01L 27/1248; G09G 3/3225
  USPC .......................................................... 257/40
  See application file for complete search history.

(56) References Cited

U.S. PATENT DOCUMENTS

| | | |
|---|---|---|
| 9,105,589 B2 | 8/2015 | Bang |
| 9,167,663 B2 | 10/2015 | Kim et al. |
| 9,324,777 B2 | 4/2016 | Kang et al. |
| 9,412,327 B2 | 8/2016 | Kim |
| 9,711,585 B2 | 7/2017 | Kim et al. |
| 9,865,667 B2 | 1/2018 | Gil et al. |
| 2002/0158835 A1 | 10/2002 | Kobayashi et al. |
| 2004/0183083 A1 | 9/2004 | Koo |
| 2006/0114190 A1* | 6/2006 | Fang .................... G09G 3/3233 345/76 |
| 2008/0315068 A1 | 12/2008 | Kanda et al. |
| 2014/0034923 A1 | 2/2014 | Kim et al. |
| 2014/0132584 A1 | 5/2014 | Kim |
| 2015/0170563 A1 | 6/2015 | Bang |
| 2016/0210896 A1 | 7/2016 | Gil |
| 2016/0260792 A1 | 9/2016 | Kim et al. |
| 2016/0306464 A1 | 10/2016 | Lee |
| 2016/0329391 A1 | 11/2016 | Ko et al. |
| 2016/0380039 A1 | 12/2016 | Oh et al. |

FOREIGN PATENT DOCUMENTS

| | | | |
|---|---|---|---|
| CN | 104732917 | | 6/2015 |
| CN | 105938704 | | 9/2016 |
| CN | 105989804 | | 10/2016 |
| CN | 106129061 | | 11/2016 |
| EP | 3091575 | | 11/2016 |
| JP | 2009259570 | A * | 11/2009 |
| KR | 10-2012-0010824 | | 2/2012 |
| KR | 10-2014-0061140 | | 5/2014 |
| KR | 10-2016-0089596 | | 7/2016 |
| KR | 10-2016-0122934 | | 10/2016 |
| TW | I257496 | | 7/2006 |

OTHER PUBLICATIONS

Final Office Action dated Jul. 25, 2019, in U.S. Appl. No. 15/844,645.
Advisory Action dated Oct. 30, 2019, in U.S. Appl. No. 15/844,645.
Notice of Allowance dated Jan. 6, 2020, in U.S. Appl. No. 15/844,645.
Non-Final Office Action dated Jul. 23, 2021, issued to U.S. Appl. No. 16/871,505.
Final Office Action dated Nov. 16, 2021, issued to U.S. Appl. No. 16/871,505.
Non-Final Office Action dated Mar. 24, 2022, issued to U.S. Appl. No. 16/871,505.
Notice of Allowance dated Sep. 27, 2022, issued to U.S. Appl. No. 16/871,505.
Extended European Search Report dated May 25, 2018, issued in European Patent Application Mo. 17210768.2.
Chinese Patent Office Action dated Aug. 26, 2021, with respect to Chinese Patent Application No. 201711471785.0, filed Dec. 29, 2017.

* cited by examiner

DISPLAY DEVICE HAVING INTERSECTING INITIALIZATION POWER LINE PORTIONS

CROSS-REFERENCE TO RELATED APPLICATIONS

This is a Continuation of U.S. patent application Ser. No. 16/871,505, filed on May 11, 2020, which is a Continuation of U.S. patent application Ser. No. 15/844,645, filed Dec. 18, 2017, issued as U.S. Pat. No. 10,651,264, which claims priority from and the benefit of Korean Patent Application No. 10-2016-0183421, filed on Dec. 30, 2016, which is hereby incorporated by reference for all purposes as if fully set forth herein.

BACKGROUND

Field

Exemplary embodiments relate to a display device.

Discussion of the Background

Generally, display devices include a plurality of pixels. Each pixel includes a scan line configured to apply a scan signal, a data line configured to apply a data signal, and a power line configured to apply power. An organic light-emitting display device of such display devices may have a structure in which a plurality of power lines are coupled to each pixel.

A current (IR) drop phenomenon due to resistance may be caused in the power lines. If the current drop phenomenon occurs, a difference in luminance between pixels coupled to the same power lines may be caused.

Furthermore, if a power line opens, power is not applied to pixels which are disposed beyond an open point with respect to a direction in which current flows. Therefore, a dark spot may occur in the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device having improved display quality.

Additional aspects will be set forth in the detailed description which follows, and, in part, will be apparent from the disclosure, or may be learned by practice of the inventive concept.

An exemplary embodiment may provide a display device including a substrate including a pixel area and a peripheral area, pixels provided in the pixel area of the substrate, each of the pixels including a light-emitting element provided with a pixel electrode, scan lines and data lines coupled to the pixels, a power line configured to supply driving power to the light-emitting elements, and extending in one direction, and an initialization power line configured to supply initialization power to the light-emitting elements. The power line and the initialization power line may be provided on different layers. The initialization power line may include a plurality of first conductive lines extending in a direction oblique to the scan lines and the data lines, and a plurality of second conductive lines intersecting the first conductive lines, wherein the first conductive lines and the second conductive lines may be disposed in areas between the pixel electrodes of adjacent light-emitting elements.

In an embodiment, a single light-emitting element may be disposed in each of areas formed by intersecting the first conductive lines and the second conductive lines.

In an embodiment, portions of at least either the first conductive lines or the second conductive lines may be removed, and a plurality of light-emitting elements may be disposed in each of areas formed by intersecting the first conductive lines and the second conductive lines.

In an embodiment, portions of at least either the first conductive lines or the second conductive lines may be bent, and the bent portions may be repeatedly formed.

In an embodiment, the first conductive lines and the second conductive lines may include a first region, and a second region coupled to the first region. A width of the first region may be greater than a width of the second region.

In an embodiment, the first region may be parallel with either the data lines or the scan lines.

An exemplary embodiment may provide a display device including pixels each including at least one transistor provided on a substrate, a protective layer configured to cover the transistor, and a light-emitting element provided over the protective layer and coupled to the transistor, scan lines and data lines coupled to the pixels, a power line configured to supply driving power to the light-emitting elements of the pixels, and extending in one direction; and an initialization power line provided over the protective layer and configured to supply initialization power to the light-emitting elements. The transistor may include an active pattern provided on the substrate, a source electrode and a drain electrode coupled to the active pattern, a gate electrode provided over the active pattern with a gate insulating layer interposed therebetween, and an interlayer insulating layer including a first interlayer insulating layer and a second interlayer insulating layer successively stacked and configured to cover the gate electrode. The power line may be provided over the second interlayer insulating layer. The initialization power line may include a plurality of first conductive lines extending in a direction oblique to the scan lines and the data lines, and a plurality of second conductive lines intersecting the first conductive lines. The first conductive lines and the second conductive lines may be spaced apart from the light-emitting elements.

In an embodiment, the pixel may further include a storage capacitor. The storage capacitor may further include: a lower electrode coupled to the gate electrode; an upper electrode configured to overlap the lower electrode; and the first interlayer insulating layer provided between the lower electrode and the upper electrode.

In an embodiment, the light-emitting element may include a first electrode provided over the protective layer, a light-emitting layer provided over the first electrode, and a second electrode provided over the light-emitting layer. The power line may be coupled to the first electrode through a contact hole passing through the protective layer.

In an embodiment, a voltage applied to the power line may be higher than a voltage applied to the second electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
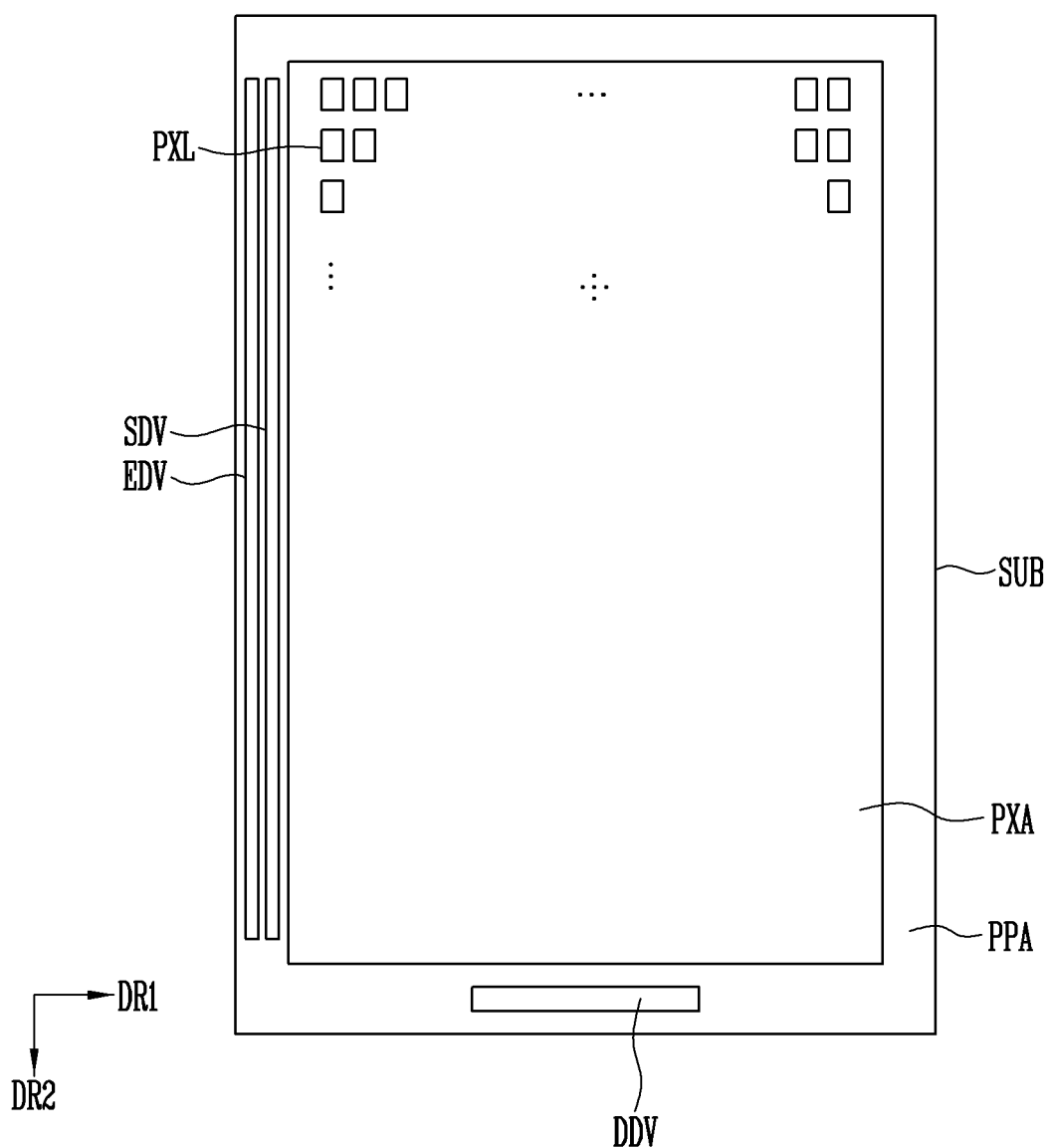
FIG. 1 is a plan view illustrating a display device in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view illustrating a display device in accordance with an exemplary embodiment.

Referring to FIG. 1, the display device in accordance with an exemplary embodiment may include a substrate SUB, pixels PXL provided on the substrate SUB, a drive unit provided on the substrate SUB and configured to drive the pixels PXL, and a line unit (not shown) configured to couple the pixels PXL with the drive unit.

The substrate SUB may include a pixel area PXA, and a peripheral area PPA. The pixel area PXA may be an area in which the pixels PXL for displaying an image are provided. Each pixel PXL will be described later herein. The peripheral area PPA may be an area in which the pixels PXL are not provided and an image is not displayed. The drive unit for driving the pixels PXL, and a part of the line unit (not shown) for coupling the pixels PXL with the drive unit may be provided in the peripheral area PPA. The peripheral area PPA may correspond to a bezel to be formed in the final product of the display device. The width of the bezel may be determined depending on the width of the peripheral area PPA.

The pixel area PXA may have various shapes. For example, the pixel area PXA may be provided in various forms, such as a closed polygon, a circle, an ellipse, or a shape including a side formed of a curved line, and a semicircle, a semi-ellipse, or a shape including sides formed of a linear line and a curved line. In the case where the pixel area PXA includes a plurality of areas, each area may be provided in various forms such as a closed polygon, a circle, an ellipse, or a shape including a side formed of a curved line, and a semicircle, a semi-ellipse, or a shape including sides formed of a linear line and a curved line. The surface areas of the plurality of areas may be the same as or different from each other.

In the present exemplary embodiment, an example in which the pixel area PXA is provided with a single area having a rectangular shape including linear sides will be described.

The peripheral area PPA may be provided on at least one side of the pixel area PXA. In an exemplary embodiment, the peripheral area PPA may enclose the periphery of the pixel area PXA. In an exemplary embodiment, the peripheral area PPA may include a horizontal part which extends in a transverse direction of the display device, and a vertical part which extends in a longitudinal direction of the display device. The vertical part of the peripheral area PPA may comprise a pair of vertical parts which are spaced apart from each other with respect to the transverse direction of the pixel area PXA.

The pixels PXL may be provided in the pixel area PXA on the substrate SUB. Each pixel PXL refers to a smallest unit for displaying an image, and a plurality of pixels may be provided. The pixels PXL may include an organic light-emitting device which emits white light and/or color light. Each pixel PXL may emit light having any one color among red, green, and blue, and it is not limited thereto. For example, each pixel PXL may emit light having any one color among cyan, magenta, yellow, and white.

The pixels PXL may be arranged in a matrix form along rows extending in a first direction DR1 and columns extending in a second direction DR2. However, the arrangement of the pixels PXL is not limited to a particular arrangement. In other words, the pixels PXL may be arranged in various forms. For example, some of the pixels PXL may be arranged such that the first direction DR1 is the row direction, but the remaining pixels PXL may be arranged such that a direction other than the first direction DR1, e.g., a direction oblique to the first direction DR1, is the row direction. Alternatively, the pixels PXL may be arranged such that a direction oblique to the first and second directions DR1 and DR2 is the column direction, and a direction interesting the column direction is the row direction. Here, the column direction may be oblique to the first and second directions DR1 and DR2.

The drive unit may provide a signal to each pixel PXL through the line unit and thus control the operation of the pixel PXL. In FIG. 1, the line unit is omitted for the sake of explanation. The line unit will be described later herein.

The drive unit may include a scan driver SDV configured to provide a scan signal to each pixel PXL through a scan line, an emission driver EDV configured to provide an emission control signal to the pixel PXL through an emission control signal, a data driver DDV configured to provide a data signal to the pixel PXL through a data line, and a timing controller (not shown). The timing controller may control the scan driver SDV, the emission driver EDV, and the data driver DDV.

The scan driver SDV may be disposed in the vertical part of the peripheral area PPA. In an embodiment, a pair of vertical parts of the peripheral area PPA may be provided at positions spaced apart from each other with reference to the transverse direction of the pixel area PXA, and the scan driver SDV may be provided in at least one of the vertical parts of the peripheral area PPA. The scan driver SDV may extend a predetermined length in the longitudinal direction of the peripheral area PPA.

In an exemplary embodiment, the scan driver SDV may be directly mounted on the substrate SUB. In the case where the scan driver SDV is directly mounted on the substrate SUB, it may be formed together with the pixels PXL during a process of forming the pixels PXL. However, the location at which the scan driver SDV is disposed or the method of providing the scan driver SDV is not limited to this. For example, the scan driver SDV may be provided on a separate chip and then mounted on the substrate SUB in a chip-on-glass manner. Alternatively, the scan driver SDV may be mounted on a printed circuit board and then coupled to the substrate SUB by a connector.

The emission driver EDV may also be disposed in the vertical part of the peripheral area PPA in a manner similar to that of the scan driver SDV. The emission driver EDV may be disposed in at least one of the vertical parts of the peripheral area PPA. The emission driver EDV may extend a predetermined length in the longitudinal direction of the peripheral area PPA.

In an exemplary embodiment, the emission driver EDV may be directly mounted on the substrate SUB. In the case where the emission driver EDV is directly mounted on the substrate SUB, it may be formed together with the pixels PXL during the process of forming the pixels PXL. However, the location at which the emission driver EDV is disposed or the method of providing the emission driver EDV is not limited to this. For example, the emission driver EDV may be provided on a separate chip and then mounted on the substrate SUB in a chip-on-glass manner. Alternatively, the emission driver EDV may be mounted on a printed circuit board and then coupled to the substrate SUB by a connector.

In an exemplary embodiment, there has been illustrated an example in which the scan driver SDV and the emission driver EDV are disposed adjacent to each other and formed in only one side of the vertical parts of the peripheral area PPA. However, the present disclosure is not limited to this. The arrangement of the scan driver SDV and the emission driver EDV may be changed in various ways. For example, the scan driver SDV may be provided in one of the vertical parts of the peripheral area PPA, and the emission driver EDV may be provided in the other vertical part of the peripheral area PPA. Alternatively, the scan driver SDV may be provided in both the vertical parts of the peripheral area PPA, and the emission driver EDV may be provided in only one of the vertical parts of the peripheral area PPA.

The data driver DDV may be disposed in the peripheral area PPA. The data driver DDV may be disposed in the horizontal part of the peripheral area PPA. The data driver DDV may extend a predetermined length in the transverse direction of the peripheral area PPA.

In an exemplary embodiment, the locations of the scan driver SDV, the emission driver EDV, and/or the data driver DDV may be changed with each other, as needed.

The timing controller (not shown) may be coupled to the scan driver SDV, the emission driver EDV, and the data driver DDV through lines in various manners. The location at which the timing controller is disposed is not limited to a particular location. For example, the timing controller may be mounted on a printed circuit board and coupled to the scan driver SDV, the emission driver EDV, and the data driver DDV through a flexible printed circuit board. The printed circuit board on which the timing controller is mounted may be disposed at various positions, e.g., on a side of the substrate SUB or a rear surface of the substrate SUB.

Figure 2:
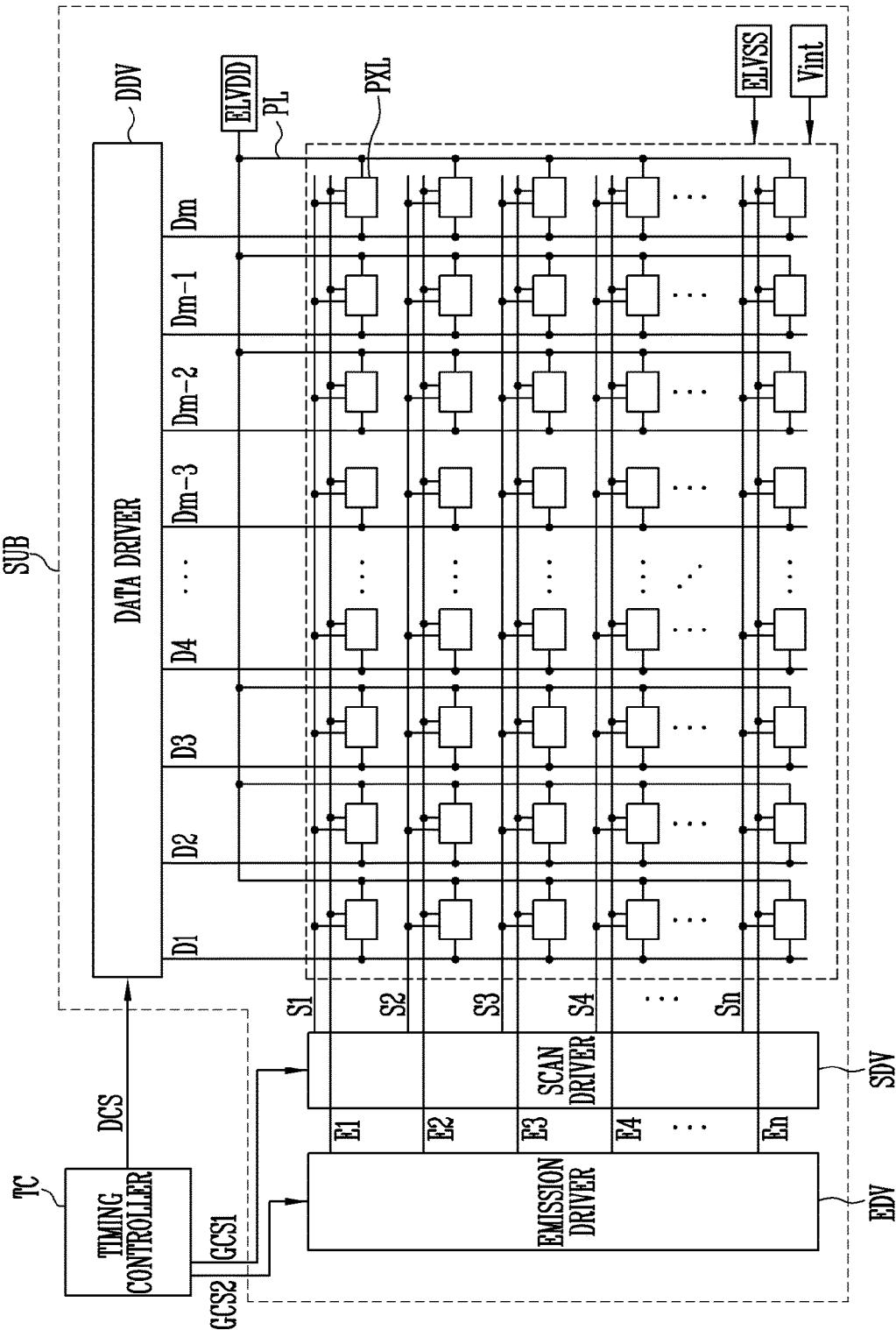
FIG. 2 is a block diagram illustrating pixels and a drive unit in accordance with an exemplary embodiment.

FIG. 2 is a block diagram illustrating pixels and a drive unit in accordance with an exemplary embodiment.

Referring to FIG. 2, the display device in accordance with an exemplary embodiment may include pixels PXL, a drive unit, and a line unit.

In an embodiment, a plurality of pixels PXL may be provided. The drive unit may include a scan driver SDV, an emission driver EDV, a data driver DDV, and a timing controller TC. The locations of the scan driver SDV, the emission driver EDV, the data driver DDV, and the timing controller TC shown in FIG. 2 are only for illustrative purposes, and they may be disposed at other locations in an actual display device.

The line unit may provide a signal from the drive unit to each pixel PXL and include scan lines, data lines, emission control lines, a power line PL, and a first initialization power line Vint1. The scan lines may include a plurality of scan lines S1 to Sn. The emission control lines may include a plurality of emission control lines E1 to En. The data lines D1 to Dm and the power line PL may be coupled to the pixels PXL.

The pixels PXL may be disposed in the pixel area PXA. The pixels PXL may be coupled to the scan lines S1 to Sn, the emission control lines E1 to En, the data lines D1 to Dm, and the power line PL. The pixels PXL may be supplied with a data signal from the data lines D1 to Dm when a scan signal is supplied from the scan lines S1 to Sn.

The pixels PXL may be supplied with a first driving power supply ELVDD, a second driving power supply ELVSS, and an initialization power supply Vint. The first driving power supply ELVDD may be applied through the power line PL.

Each of the pixels PXL may include a driving transistor and an organic light-emitting diode, which are not illustrated. In response to the data signal, the driving transistor may control the amount of current flowing from the first driving power supply ELVDD to the second driving power supply ELVSS via the organic light-emitting diode. Before the data signal is supplied to each pixel PXL, a gate electrode of the drive transistor may be initialized by the voltage of the initialization power supply Vint. Owing to this, the initialization power supply Vint may be set to a voltage lower than that of the data signal.

The scan driver SDV may supply the scan signal to the scan lines S1 to Sn in response to a first gate control signal GCS1 supplied from the timing controller TC. For example, the scan driver SDV may successively supply the scan signal to the scan lines S1 to Sn. When the scan signal is sequentially supplied to the scan lines S1 to Sn, the pixels PXL may be sequentially selected in a horizontal line basis.

The emission driver EDV may supply the emission control signal to the emission control lines E1 to En in response to a second gate control signal GCS2 supplied from the timing controller TC. For example, the emission driver EDV may sequentially provide the emission control signal to the emission control lines E1 to En.

The emission control signal may be set to have a width greater than that of the scan signal. For instance, the emission control signal may be supplied to an i-th (i is a natural number) emission control line Ei such that the period of the emission control signal at least partially overlaps that of the scan signal supplied to an i–1-th scan line Si–1 and the scan signal supplied to an i-th can line.

In addition, the emission control signal may be set to a gate-off voltage (e.g., a high voltage) so that the transistors included in the pixels PXL may be turned off. The scan signal may be set to a gate-on voltage (e.g., a low voltage) so that the transistors included in the pixels PXL may be turned on.

The data driver DDV may supply the data signal to the data lines D1 to Dm in response to a data control signal DCS. The data signal supplied to the data lines D1 to Dm may be supplied to the pixels PXL selected by the scan signal.

The timing control unit TC may supply, to the scan driver SDV and the emission driver EDV, the gate control signals GCS1 and GCS2 generated based on timing signals supplied from an external device. The timing control unit TC may supply the data control signal DCS to the data driver DDV.

Each of the gate control signals GCS1 and GCS2 may include a start pulse and clock signal. The start pulse may control a timing of a first scan signal or a first emission control signal. The clock signals may be used to shift the start pulse.

The data control signal DCS may include a source start pulse and clock signal. The source start pulse may control the time at which the sampling of data starts. The clock signals may be used to control a sampling operation.

Figure 3:
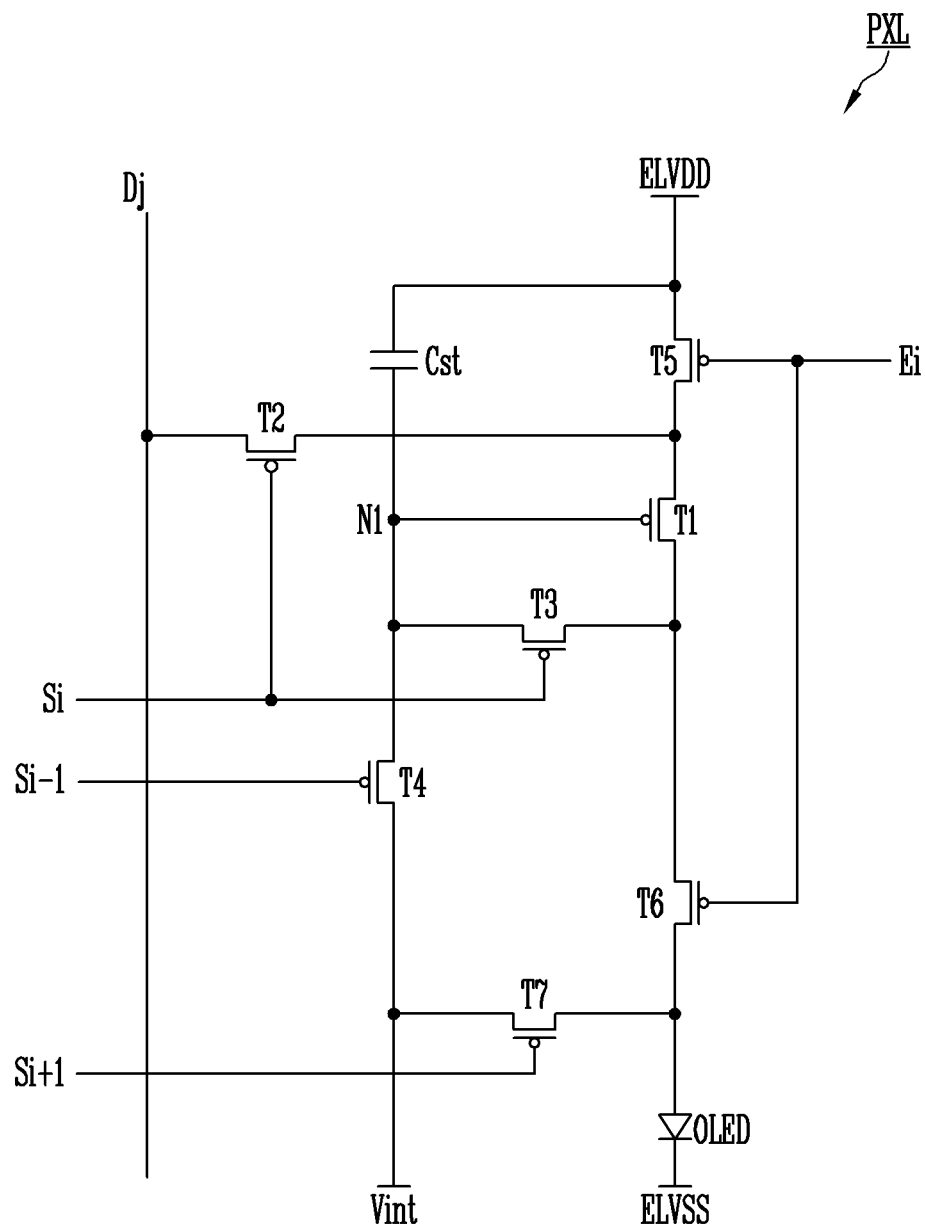
FIG. 3 is an equivalent circuit diagram illustrating an embodiment of a pixel shown in FIG. 2.

FIG. 3 is an equivalent circuit diagram illustrating an embodiment of a pixel shown in FIG. 2. In FIG. 3, for the sake of description, there is a pixel coupled to a j-th data line Dj and the i-th scan line Si illustrated.

Referring to FIGS. 2 and 3, the pixel PXL in accordance with an exemplary embodiment may include an organic light-emitting diode (OLED), a first transistor T1, a second transistor T2, a third transistor T3, a fourth transistor T4, a fifth transistor T5, a sixth transistor T6, a seventh transistor T7, and a storage capacitor Cst.

The OLED may include an anode coupled to the first transistor T1 via the sixth transistor T6, and a cathode coupled to the second driving power supply ELVSS. The OLED may emit light having a predetermined luminance corresponding to current supplied from the first transistor T1.

The first driving power supply ELVDD may be set to a voltage higher than that of the second driving power supply ELVSS so that current can flow to the OLED.

The seventh transistor T7 may be coupled between the initialization power supply Vint and the anode of the OLED. A gate electrode of the seventh transistor T7 may be coupled to an i+1-th scan line Si+1. When a scan signal is supplied to the i+1-th scan line Si+1, the seventh transistor T7 may be turned on so that the voltage of the initialization power supply Vint may be supplied to the anode of the OLED. The initialization power supply Vint may be set to a voltage lower than that of the data signal.

The sixth transistor T6 may be coupled between the first transistor T1 and the OLED. A gate electrode of the sixth transistor T6 may be coupled to an i-th emission control line Ei. The sixth transistor T6 may be turned off when an emission control signal is supplied to the i-th emission control line Ei, and may be turned on in the other cases.

The fifth transistor T5 may be coupled between the first driving power supply ELVDD and the first transistor T1. A gate electrode of the fifth transistor T5 may be coupled to the i-th emission control line Ei. The fifth transistor T5 may be turned off when an emission control signal is supplied to the i-th emission control line Ei, and may be turned on in the other cases.

A first electrode of the first transistor (T1; drive transistor) may be coupled to the first driving power supply ELVDD via the fifth transistor T5, and a second electrode thereof may be coupled to the anode of the OLED via the sixth transistor T6. A gate electrode of the first transistor T1 may be coupled to a first node N1. The first transistor T1 may control, in response to the voltage of the first node N1, current flowing from the first driving power supply ELVDD to the second driving power supply ELVSS via the OLED. In other words, the first driving power supply ELVDD may be electrically coupled to the anode of the OLED through the first transistor T2.

The third transistor T3 may be coupled between the second electrode of the first transistor T1 and the first node N1. A gate electrode of the third transistor T3 may be coupled to the i-th scan line Si. When the scan signal is supplied to the i-th scan line Si, the third transistor T3 may be turned on so that the second electrode of the first transistor T1 may be electrically coupled with the first node N1. Therefore, when the third transistor T3 is turned on, the first transistor T1 may be connected in the form of a diode.

The fourth transistor T4 may be coupled between the first node N1 and the initialization power supply Vint. A gate electrode of the fourth transistor T4 may be coupled to the i−1-th scan line Si−1. When a scan signal is supplied to the i−1-th scan line Si−1, the fourth transistor T4 may be turned on so that the voltage of the initialization power supply Vint may be supplied to the first node N1.

The second transistor T2 may be coupled between the j-th data line Dj and the first electrode of the first transistor T1. A gate electrode of the second transistor T2 may be coupled to the i-th scan line Si. When the scan signal is supplied to the i-th scan line Si, the second transistor T2 may be turned on so that the first electrode of the first transistor T1 may be electrically coupled with the j-th data line Dj.

The storage capacitor Cst may be coupled between the first driving power supply ELVDD and the first node N1. The storage capacitor Cst may store a voltage corresponding both to the data signal and a threshold voltage of the first transistor T1.

In an exemplary embodiment, the direction in which the scan lines and the emission control lines extend may be changed. For example, unlike the foregoing exemplary embodiment in which the scan lines and the emission control lines extend in the first direction DR1 that is the transverse direction, the scan lines and the emission control lines may extend in the second direction DR2 that is the longitudinal direction.

Figure 4:
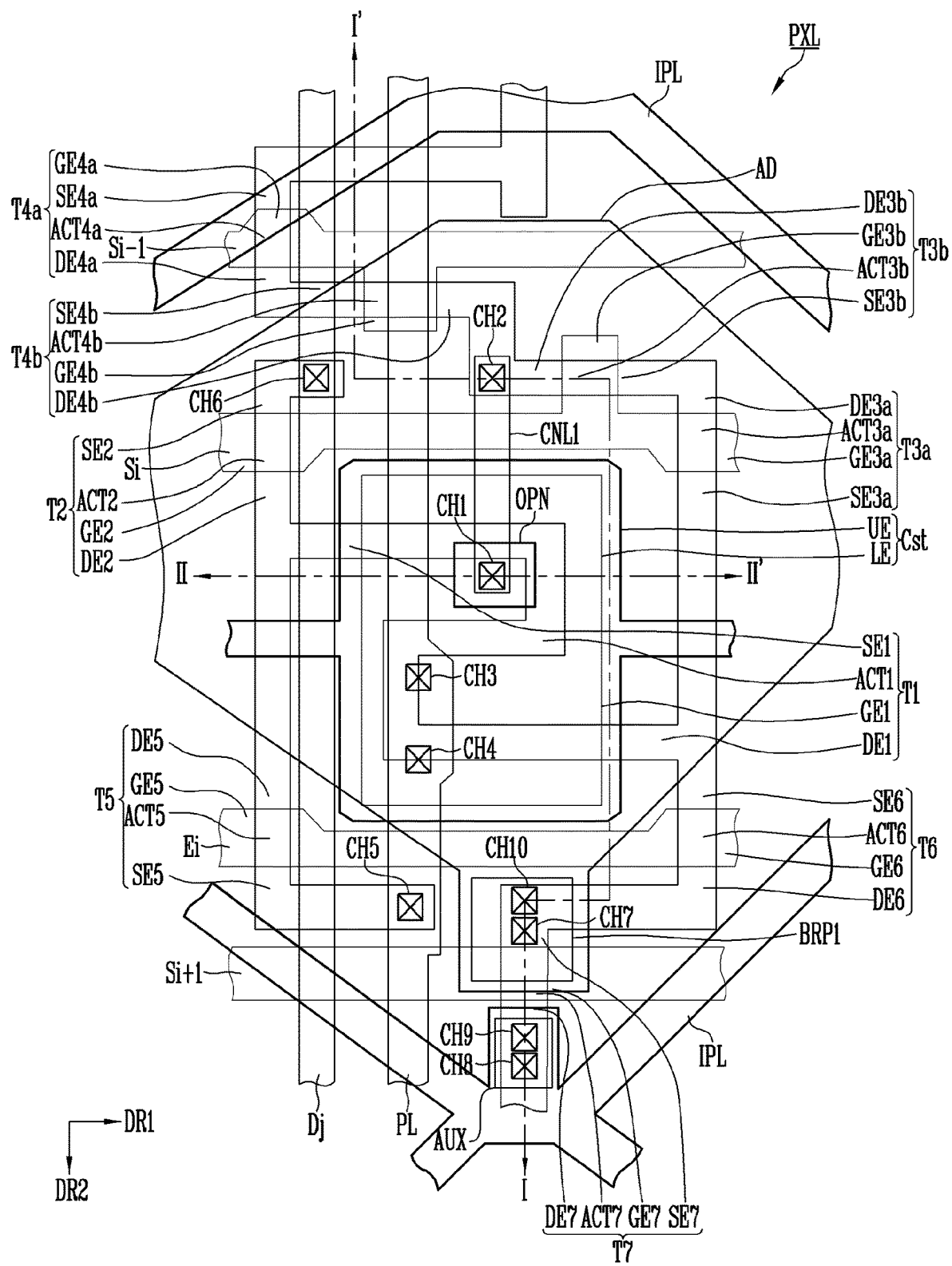
FIG. 4 is a plan view illustrating in detail the pixel shown in FIG. 3.
Figure 5:
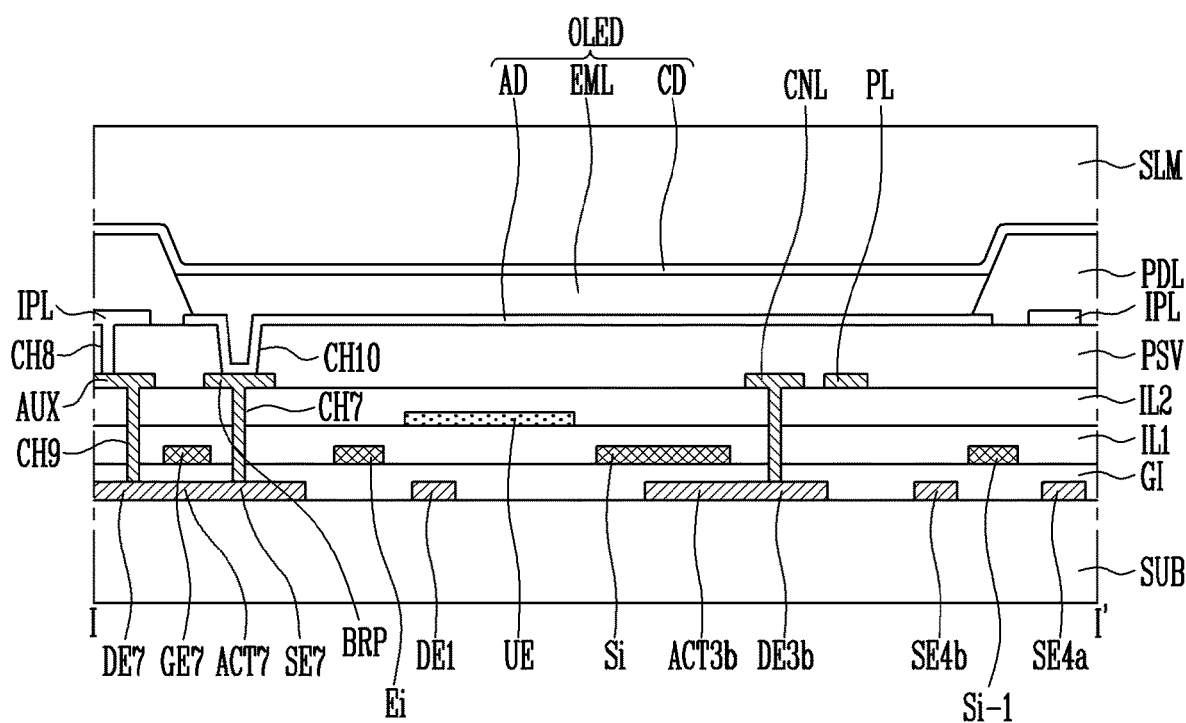
FIG. 5 is a sectional view taken along line I-I' of FIG. 4.
Figure 6:
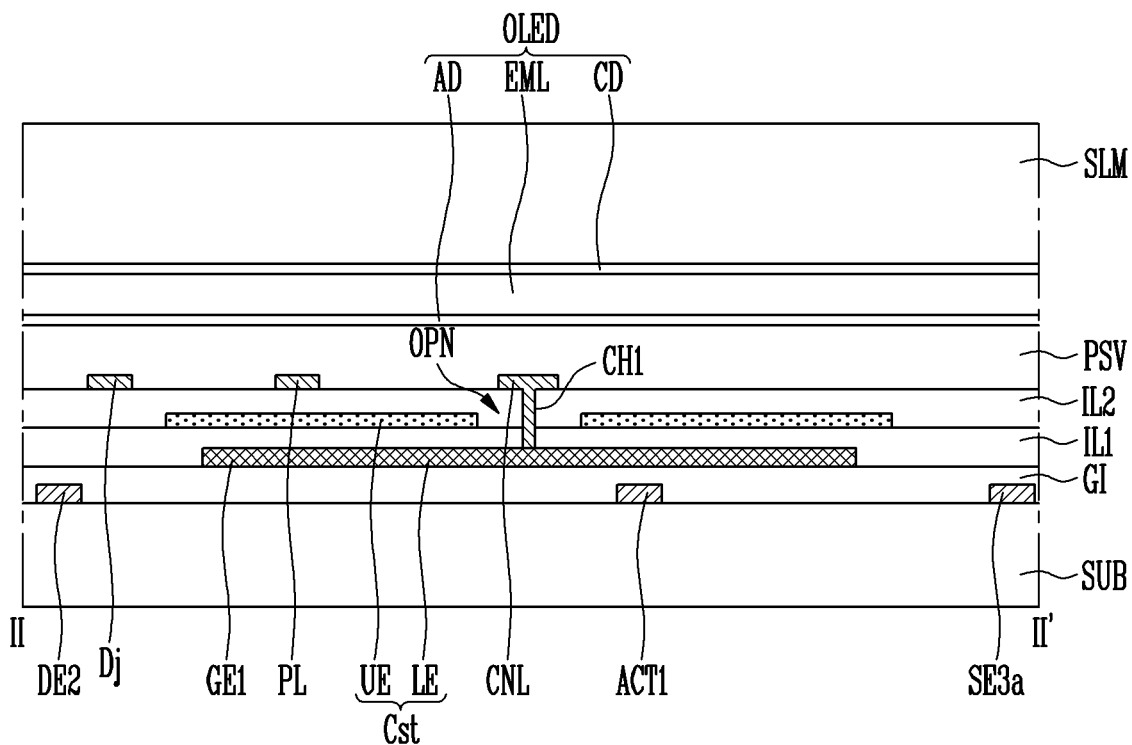
FIG. 6 is a sectional view taken along line II-II' of FIG. 4.

FIG. 4 is a plan view illustrating in detail the pixel shown in FIG. 3, FIG. 5 is a sectional view taken along line I-I' of FIG. 4, and FIG. 6 is a sectional view taken along line II-II' of FIG. 4.

In FIGS. 4 to 6, based on a pixel PXL disposed on an i-th row and a j-th column in the pixel area PXA, there are illustrated three scan lines Si−1, Si, and Si+1, an emission control line Ei, a power line PL, and a data line Dj which are coupled to the single pixel PXL. In FIGS. 4 to 6, for the sake of description, a scan line of the i−1-th row refers to "i−1-th scan line Si−1", a scan line of the i-th row refers to "i-th scan line Si", a scan line of the i+1-th row refers to "i+1-th scan line Si+1", an emission control line of the i-th row refers to "emission control line Ei", a data line of the j-th column refers to "data line Dj", and a j-th power line refers to "power line PL".

Referring to FIGS. 2 to 6, the display device may include the substrate SUB, the line unit, and the pixels PXL.

The substrate SUB may include transparent insulating material to allow light transmission. The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials constituting the substrate SUB may be changed, and include, for example, fiber reinforced plastic (FRP).

The line unit may be provided on each of the pixels PXL and include the scan lines Si−1, Si, and Si+1, the data line Dj, the emission control line Ei, the power line PL, and an initialization power line IPL.

The scan lines Si−1, Si and Si+1 may extend in the first direction DR1. The scan lines Si−1, Si, and Si+1 may include the i−1-th scan line Si−1, the i-th scan line Si, and the i+1-th scan line Si+1 which are successively arranged in the second direction DR2. The scan lines Si−1, Si, and Si+1 may receive scan signals. For instance, the i−1-th scan line Si−1 may receive an i−1-th scan signal. The i-th scan line Si may receive an i-th scan signal. The i+1-th scan line Si+1 may receive an i+1-th scan signal.

The emission control line Ei may extend in the first direction DR1. The emission control line Ei may be disposed between the i-th scan line Si and the i+1-th scan line Si+1 at a position spaced apart from the i-th scan line Si and the i+1-th scan line Si+1. The emission control line Ei may receive an emission control signal.

The data line Dj may extend in the second direction DR2. The data line Dj may receive a data signal.

The power line PL may extend in the second direction DR2. The power line PL may be disposed at a position spaced apart from the data line Dj. The first driving power supply (refer to ELVDD of FIGS. 2 and 3) may be applied to the power line PL.

The initialization power supply Vint may be applied to the initialization power line IPL. The initialization power line IPL may bypass OLEDs. In other words, the initialization power line IPL may not overlap the OLEDs.

Each of the pixel PXL may include the first transistor T1, the second transistor T2, the third transistor T3, the fourth transistor T4, the fifth transistor T5, the sixth transistor T6, the seventh transistor T7, the storage capacitor Cst, and the OLED.

The first transistor T1 may include a first gate electrode GE1, a first active pattern ACT1, a first source electrode SE1, a first drain electrode DE1, and a connection line CNL.

The first gate electrode GE1 may be coupled with a third drain electrode DE3 of the third transistor T3 and a fourth drain electrode DE4 of the fourth transistor T4. The connection line CNL may couple the first gate electrode GE1, the third drain electrode DE3, and the fourth drain electrode DE4 to each other. A first end of the connection line CNL may be coupled with the first gate electrode GE through a first contact hole CH1. A second end of the connection line CNL may be coupled with the third drain electrode DE3 and the fourth drain electrode DE4 through a second contact hole CH2.

In an exemplary embodiment, each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be formed of a semiconductor layer doped with an impurity. The first active pattern ACT1 may be formed of an undoped semiconductor layer.

The first active pattern ACT1 may have a bar shape, extending in a predetermined direction, and be bent several times along the longitudinal direction. The first active pattern ACT1 may overlap the first gate electrode GE1 in a plan view. As the first active pattern ACT1 may be relatively long, a channel area of the first transistor T1 may also be relatively long. Thus, a driving range of a gate voltage to be applied to the first transistor T1 may be increased. Consequently, the gradation of light emitted from the OLED may be precisely controlled.

The first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5. The first drain electrode DE1 may be coupled to a second end of the first active pattern ACT1. The first drain electrode DE1 may be coupled with the third drain electrode DE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be coupled to the i-th scan line Si. The second gate electrode GE2 may be provided as a part of the i-th scan line Si or formed to have a shape protruding from the i-th scan line Si. In an exemplary embodiment, each of the second active pattern ACT2, the second source electrode SE2, and the second drain electrode DE2 may be formed of an undoped semiconductor layer or a semiconductor layer doped with an impurity. For example, each of the second source electrode SE2 and the second drain electrode DE2 may be formed of a semiconductor layer doped with an impurity. The second active pattern ACT2 may be formed of an undoped semiconductor layer. The second active pattern ACT2 may correspond to a portion of the second transistor T2 that overlaps the second gate electrode GE2. A first end of the second source electrode SE2 may be coupled to the second active pattern ACT2. A second end of the second source electrode SE2 may be coupled to the data line Dj through a sixth contact hole CH6. A first end of the second drain electrode DE2 may be coupled to the second active pattern ACT2. A second end of the second drain electrode DE2 may be coupled with the first source electrode SE1 of the first transistor T1 and the fifth drain electrode DE5 of the fifth transistor T5.

The third transistor T3 may have a double gate structure to prevent current leakage. In other words, the third transistor T3 may include a 3a-th transistor T3$a$, and a 3b-th transistor T3$b$. The 3a-th transistor T3$a$ may include a 3a-th gate electrode GE3$a$, a 3a-th active pattern ACT3$a$, a 3a-th source electrode SE3$a$, and a 3a-th drain electrode DE3$a$. The 3b-th transistor T3$b$ may include a 3b-th gate electrode GE3$b$, a 3b-th active pattern ACT3$b$, a 3b-th source electrode SE3$b$, and a 3b-th drain electrode DE3$b$. Hereinbelow, the 3a-th gate electrode GE3$a$ and the 3b-th gate electrode GE3$b$ will be referred to as "third gate electrode GE3." The 3a-th active pattern ACT3$a$ and the 3b-th active pattern ACT3$b$ will be referred to as "third active pattern ACT3." The 3a-th source electrode SE3$a$ and the 3b-th source electrode SE3$b$ will be referred to as "third source electrode SE3." The 3a-th drain electrode DE3$a$ and the 3b-th drain electrode DE3$b$ will be referred to as "third drain electrode DE3."

The third gate electrode GE3 may be coupled to the i-th scan line Si. The third gate electrode GE3 may be provided as a part of the i-th scan line Si or formed to have a shape protruding from the i-th scan line Si. For example, the 3a-th gate electrode GE3$a$ may have a shape protruding from the i-th scan line Si. The 3b-th gate electrode GE3$b$ may be provided as a part of the i-th scan line Si.

Each of the third active pattern ACT3, the third source electrode SE3, and the third drain electrode DE3 may be formed of an undoped semiconductor layer or a semiconductor layer doped with an impurity. For example, each of the third source electrode SE3 and the third drain electrode DE3 may be formed of a semiconductor layer doped with an impurity. The third active pattern ACT3 may be formed of an undoped semiconductor layer. The third active pattern ACT3 may correspond to a portion of the third transistor T3 that overlaps the third gate electrode GE3. A first end of the third source electrode SE3 may be coupled to the third active pattern ACT3. A second end of the third source electrode SE3 may be coupled with the first drain electrode DE1 of the first transistor T1 and the sixth source electrode SE6 of the sixth transistor T6. A first end of the third drain electrode DE3 may be coupled to the third active pattern ACT3. A second end of the third drain electrode DE3 may be coupled to the fourth drain electrode DE4 of the fourth transistor T4. The third drain electrode DE3 may be coupled to the first gate electrode GE1 of the first transistor T1 by the connection line CNL through the second contact hole CH2 and the first contact hole CH1.

The fourth transistor T4 may have a double gate structure to prevent current leakage. The fourth transistor T4 may include a 4a-th transistor, and a 4b-th transistor. The 4a-th transistor may include a 4a-th gate electrode GE4$a$, a 4a-th active pattern ACT4$a$, a 4a-th source electrode SE4$a$, and a 4a-th drain electrode DE4$a$. The 4b-th transistor may include a 4b-th gate electrode GE4$b$, a 4b-th active pattern ACT4$b$, a 4b-th source electrode SE4$b$, and a 4b-th drain electrode DE4$b$. Hereinbelow, the 4a-th gate electrode GE4$a$ and the 4b-th gate electrode GE4$b$ will be referred to as "fourth gate electrode GE4." The 4a-th active pattern ACT4$a$ and the 4b-th active pattern ACT4$b$ will be referred to as "fourth active pattern ACT4." The 4a-th source electrode SE4$a$ and the 4b-th source electrode SE4$b$ will be referred to as "fourth source electrode SE4." The 4a-th drain electrode DE4a and the 4b-th drain electrode DE4b will be referred to as "fourth drain electrode DE4."

The fourth gate electrode GE4 may be coupled to the i−1-th scan line Si−1. The fourth gate electrode GE4 may be provided as a part of the i−1-th scan line Si−1 or formed to have a shape protruding from the i−1-th scan line Si−1. For example, the 4a-th gate electrode GE4a may be provided as a part of the i−1-th scan line Si−1. The 4b-th gate electrode GE4b may be formed to have a shape protruding from the i−1-th scan line Si−1.

Each of the fourth active pattern ACT4, the fourth source electrode SE4, and the fourth drain electrode DE4 may be formed of an undoped semiconductor layer or a semiconductor layer doped with an impurity. For example, each of the fourth source electrode SE4 and the fourth drain electrode DE4 may be formed of a semiconductor layer doped with an impurity. The fourth active pattern ACT4 may be formed of an undoped semiconductor layer. The fourth active pattern ACT4 may correspond to a portion of the fourth transistor T4 that overlaps the fourth gate electrode GE4.

A first end of the fourth source electrode SE4 may be coupled to the fourth active pattern ACT4. A second end of the fourth source electrode SE4 may be coupled to a seventh drain electrode DE7 of the seventh transistor T7 of a pixel PXL disposed on the i−1-th row. A first end of the fourth drain electrode DE4 may be coupled to the fourth active pattern ACT4. A second end of the fourth drain electrode DE4 may be coupled to the third drain electrode DE3 of the third transistor T3. The fourth drain electrode DE4 may be coupled to the first gate electrode GE1 of the first transistor T1 by the connection line CNL through the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be coupled to the emission control line Ei. The fifth gate electrode GE5 may be provided as a part of the emission control line Ei, or formed to have a shape protruding from the emission control line Ei. Each of the fifth active pattern ACT5, the fifth source electrode SE5, and the fifth drain electrode DE5 may be formed of an undoped semiconductor layer or a semiconductor layer doped with an impurity. For example, each of the fifth source electrode SE5 and the fifth drain electrode DE5 may be formed of a semiconductor layer doped with an impurity. The fifth active pattern ACT5 may be formed of an undoped semiconductor layer. The fifth active pattern ACT5 may correspond to a portion of the fifth transistor T5 that overlaps the fifth gate electrode GE5. A first end of the fifth source electrode SE5 may be coupled to the fifth active pattern ACT5. A second end of the fifth source electrode SE5 may be coupled to the power line PL through a fifth contact hole CH5. A first end of the fifth drain electrode DE5 may be coupled to the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be coupled to the emission control line Ei. The sixth gate electrode GE6 may be provided as a part of the emission control line Ei, or formed to have a shape protruding from the emission control line Ei. Each of the sixth active pattern ACT6, the sixth source electrode SE6, and the sixth drain electrode DE6 may be formed of an undoped semiconductor layer or a semiconductor layer doped with an impurity. For example, each of the sixth source electrode SE6 and the sixth drain electrode DE6 may be formed of a semiconductor layer doped with an impurity. The sixth active pattern ACT6 may be formed of an undoped semiconductor layer. The sixth active pattern ACT6 may correspond to a portion of the sixth transistor T6 that overlaps the sixth gate electrode GE6. A first end of the sixth source electrode SE6 may be coupled to the sixth active pattern ACT6. A second end of the sixth source electrode SE6 may be coupled with the first drain electrode DE1 of the first transistor T1 and the third source electrode SE3 of the third transistor T3. A first end of the sixth drain electrode DE6 may be coupled to the sixth active pattern ACT6. A second end of the sixth drain electrode DE6 may be coupled to the seventh source electrode SE7 of the seventh transistor T7.

The seventh transistor T7 may include a seventh gate electrode GE7, a seventh active pattern ACT7, a seventh source electrode SE7, and a seventh drain electrode DE7.

The seventh gate electrode GE7 may be coupled to the i+1-th scan line Si+1. The seventh gate electrode GE7 may be provided as a part of the i+1-th scan line Si+1 or formed to have a shape protruding from the i+1-th scan line Si+1. Each of the seventh active pattern ACT7, the seventh source electrode SE7, and the seventh drain electrode DE7 may be formed of an undoped semiconductor layer or a semiconductor layer doped with an impurity. For example, each of the seventh source electrode SE7 and the seventh drain electrode DE7 may be formed of a semiconductor layer doped with an impurity. The seventh active pattern ACT7 may be formed of an undoped semiconductor layer. The seventh active pattern ACT7 may correspond to a portion of the seventh transistor T7 that overlaps the seventh gate electrode GE7. A first end of the seventh source electrode SE7 may be coupled to the seventh active pattern ACT7. A second end of the seventh source electrode SE7 may be coupled to the sixth drain electrode DE6 of the sixth transistor T6. A first end of the seventh drain electrode DE7 may be coupled to the seventh active pattern ACTT. A second end of the seventh drain electrode DE7 may be coupled to the initialization power line IPL. An auxiliary connection line AUX may be provided between the second end of the seventh drain electrode DE7 and the initialization power line IPL. A first end of the auxiliary connection line AUX may be coupled with the seventh drain electrode DE7 through a ninth contact hole CH9. A second end of the auxiliary connection line AUX may be coupled with the initialization power line IPL through an eighth contact hole CH8. In other words, the initialization power line IPL may be electrically coupled to the seventh drain electrode DE7 through the eighth contact hole CH8 and the ninth contact hole CH9. Furthermore, the second end of the seventh drain electrode DE7 may be coupled to the fourth source electrode SE4 of the fourth transistor T4 of a pixel PXL disposed on the i+1-th row. Therefore, both the seventh drain electrode DE7, and the fourth source electrode SE4 of the fourth transistor T4 of the pixel PXL disposed on the i+1-th row may be coupled to the initialization power line IPL by the auxiliary connection line AUX through the eighth contact hole CH8 and the ninth contact hole CH9.

The storage capacitor Cst may include a lower electrode LE and an upper electrode UE. The lower electrode LE may be formed of the first gate electrode GE1 of the first transistor T1.

The upper electrode UE may overlap the first gate electrode GE1, and cover the lower electrode LE in a plan view. The capacity of the storage capacity Cst may be increased by increasing an overlapping area between the upper electrode UE and the lower electrode LE. The upper electrode UE may extend in the first direction DR1. In an exemplary embodiment, a voltage having the same level as that of the first driving power supply ELVDD may be applied to the upper electrode UE. The upper electrode UE may include an opening OPN in an area having the first contact hole CH1 through which the first gate electrode GE1 makes contact with the connection line CNL.

The OLED may include a first electrode AD, a second electrode CD, and a light-emitting layer EML provided between the first electrode AD and the second electrode CD.

The first electrode AD may be a pixel electrode provided in a light-emitting area corresponding to each pixel PXL. The first electrode AD may be coupled to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The first electrode AD may be coupled to the bridge pattern BRP through the tenth contact hole CH10. The bridge pattern BRP may be coupled to the seventh source electrode SE7 of the seventh transistor T7 and the sixth drain electrode DE6 of the sixth transistor T6 through the seventh contact hole CH7.

The first electrode AD may be electrically coupled to the power line PL and thus supplied with the first driving power supply (refer to ELVDD of FIGS. 2 and 3). The second electrode CD may be coupled to the second driving power supply (refer to ELVSS of FIGS. 2 and 3).

Although, in FIG. 4, the first electrode AD has been illustrated as covering most of the pixel PXL, the present disclosure is not limited to this. For example, the first electrode AD may not overlap some transistors.

Hereinafter, the configuration of the display device according to an exemplary embodiment will be described in a stacking sequence with reference to FIGS. 4 to 6.

A semiconductor pattern may be provided on the substrate SUB. The semiconductor pattern may include the first to seventh active patterns ACT1 to ACT7, the first to seventh source electrodes SE1 to SE7, and the first to seventh drain electrodes DE1 to DE7. The first to seventh active patterns ACT1 to ACT7, the first to seventh source electrodes SE1 to SE7, and the first to seventh drain electrodes DE1 to DE7 may include semiconductor material.

A buffer layer (not shown) may be provided between the substrate SUB and the semiconductor pattern.

A gate insulating layer GI may be provided on the substrate SUB on which the active patterns has been formed.

The i−1-th scan line Si−1, the i-th scan line Si, and the i+1-th scan line Si+1, the emission control line Ei, and the first to the seventh gate electrodes GE1 to GE7 may be provided on the gate insulating layer GI. The first gate electrode GE1 may be the lower electrode LE of the storage capacity Cst. The second gate electrode GE2 and the third gate electrode GE3 may be integrally formed with the i-th scan line Si. The fourth gate electrode GE4 may be integrally formed with the i−1-th scan line Si−1. The fifth gate electrode GE5 and the sixth gate electrode GE6 may be integrally formed with the emission control line Ei. The seventh gate electrode GE7 may be integrally formed with the i+1-th scan line Si+1.

A first interlayer insulating layer IL1 may be provided on the substrate SUB on which the i−1-th scan line Si−1, etc. have been formed.

The upper electrode UE of the storage capacitor Cst may be provided on the first interlayer insulating layer IL1. The upper electrode UE may cover the lower electrode LE. The upper electrode UE may form the storage capacitor Cst along with the lower electrode LE, with the first interlayer insulating layer IL1 interposed between the upper and lower electrodes UE and LE.

The second interlayer insulating layer IL2 may be provided on the substrate SUB on which the upper electrode UE has been disposed.

The data line Dj, the connection line CNL, the auxiliary connection line AUX, the bridge pattern BRP, and the power line PL may be provided on the second interlayer insulating layer IL2.

The data line Dj may be coupled to the second source electrode SE2 through the sixth contact hole CH6 passing through the first interlayer insulating layer IL1, the second interlayer insulating layer IL2, and the gate insulating layer GI.

The first end of the connection line CNL may be coupled to the first gate electrode GE1 through the first contact hole CH1 passing through the first interlayer insulating layer IL1 and the second interlayer insulating layer IL2. The second end of the connection line CNL may be coupled to the third drain electrode DE3 and the fourth drain electrode DE4 through the second contact hole CH2 passing through the gate insulating layer GI, the first interlayer insulating layer IL1 and the second interlayer insulating layer IL2.

The auxiliary connection line AUX may be coupled to the seventh drain electrode DE7 through the ninth contact hole CH9 passing through the gate insulating layer GI, the first interlayer insulating layer IL1 and the second interlayer insulating layer IL2.

The bridge pattern BRP may be a pattern provided as a medium which couples the sixth drain electrode DE6, the seventh source electrode SE7, and the first electrode AD with each other between the sixth drain electrode DE6, the seventh source electrode SE7, and the first electrode AD. The bridge pattern BRP may be coupled to the sixth drain electrode DE6 and the seventh source electrode SE7 through the seventh contact hole CH7 passing through the gate insulating layer GI, the first interlayer insulating layer IL1 and the second interlayer insulating layer IL2. Therefore, the bridge pattern BRP may be electrically coupled to the first source electrode SE1 through the sixth transistor T6.

The power line PL may be coupled to the upper electrode UE of the storage capacitor Cst through the third contact hole CH3 and the fourth contact hole CH4 that pass through the second interlayer insulating layer IL2. The power line PL may be coupled to the fifth source electrode SE5 through the fifth contact hole CH5 passing through the first interlayer insulating layer IL1, the second interlayer insulating layer IL2, and the gate insulating layer GI.

A protective layer PSV may be provided on the substrate SUB on which the data line Dj, etc., have been formed.

The OLED and the initialization power line IPL may be provided on the protective layer PSV. The OLED may include the first electrode AD, the second electrode CD, and the light-emitting layer EML provided between the first electrode AD and the second electrode CD.

The initialization power line IPL and the first electrode AD may be provided on the protective layer PSV.

The initialization power line IPL may be provided on the protective layer PSV at a position spaced apart from the first electrode AD. The initialization power line IPL may include the same material as that of the first electrode AD. For example, the initialization power line IPL may include at least a transparent conductive oxide. In an exemplary embodiment, although there is illustrated an example in which the initialization power line IPL includes the transparent conductive oxide, the present disclosure is not limited thereto. For instance, the initialization power line IPL may include a reflective layer, and a transparent conductive layer provided on or under the reflective layer. The initialization power line IPL may be coupled to the auxiliary connection line AUX through the eighth contact hole CH8 passing through the protective layer PSV. Thus, the initialization power line IPL may be coupled to the seventh drain electrode DE7 by the auxiliary connection line AUX.

The first electrode AD may be coupled to the bridge pattern BRP through the tenth contact hole CH10 passing through the protective layer PSV. Since the bridge pattern BRP may be coupled to the sixth drain electrode DE6 and the seventh source electrode SE7 through the seventh contact hole CH7, the first electrode AD may be ultimately electrically coupled to the sixth drain electrode DE6 and the seventh source electrode SE7.

A pixel defining layer PDL for defining a light-emitting area corresponding to each pixel PXL may be provided on the substrate SUB on which the first electrode AD, etc. have been formed. The pixel defining layer PDL may expose an upper surface of the first electrode AD and protrude from the substrate SUB along the periphery of the pixel PXL.

The light-emitting layer EML may be provided in the light-emitting area enclosed by the pixel defining layer PDL. The second electrode CD may be provided on the light-emitting layer EML. An encapsulating layer SLM covering the second electrode CD may be provided on the second electrode CD.

Any one of the first electrode AD and the second electrode CD may be an anode electrode, and the other one may be a cathode electrode. For example, the first electrode AD may be an anode electrode, and the second electrode CD may be a cathode electrode.

Furthermore, at least one of the first electrode AD and the second electrode CD may be a transmissive electrode. For example, in the case where the OLED is a bottom-emission type OLED, the first electrode AD may be a transmissive electrode, and the second electrode CD may be a reflective electrode. In the case where the OLED is a top-emission type OLED, the first electrode AD may be a reflective electrode, and the second electrode CD may be a transmissive electrode. In the case where the OLED is a double-side emission type OLED, both the first electrode AD and the second electrode CD may be transmissive electrodes. In the present embodiment, there is illustrated an example in which the OLED is a top-emission type OLED and the first electrode AD is an anode electrode.

The first electrode AD may include a reflective layer (not shown) which reflects light, and a transparent conductive layer (not shown) which is disposed on or under the reflective layer. At least one of the transparent conductive layer and the reflective layer may be coupled with the seventh source electrode SE7.

The reflective layer may include material that is able to reflect light. For example, the reflective layer may include at least one of aluminum (Al), silver (Ag), chrome (Cr), molybdenum (Mo), platinum (Pt), nickel (Ni), and an alloy of them.

The transparent conductive layer may include transparent conductive oxide. For example, the transparent conductive layer may include at least one transparent conductive oxide of ITO (Indium Tin Oxide), IZO (Indium Zinc Oxide), AZO (Aluminum Zinc Oxide), GZO (gallium doped zinc oxide), ZTO (zinc tin oxide), GTO (Gallium tin oxide), and FTO (fluorine doped tin oxide).

The pixel defining layer PDL may include organic insulating material. For example, the pixel defining layer PDL may include at least one of polystyrene, PMMA (polymethylmethacrylate), PAN (polyacrylonitrile), PA (polyamide), PI (polyimide), PAE (polyarylether), heterocyclic polymer, parylene, epoxy, BCB (benzocyclobutene), siloxane based resin, and silane based resin.

The light-emitting layer EML may be disposed on an exposed surface of the first electrode AD. The light-emitting layer EML may have a multilayer thin-film structure including at least a light generation layer (LGL). For instance, the light-emitting layer EML may include: a hole injection layer (HIL) into which holes are injected; a hole transport layer (HTL) which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and an electron injection layer (EIL) into which electrons are injected. The hole injection layer, the hole transport layer, the hole blocking layer, the electron transport layer, and the electron transport layer of the light-emitting layer EML may be common layers which are provided in common in adjacent pixels PXL.

The color of light generated from the light generation layer may be one of red, green, blue, and white, but in the present embodiment, this is not limited. For example, the color of light generated from the light generation layer may be one of magenta, cyan, and yellow.

The second electrode CD may be a semi-transmissive reflective layer. For example, the second electrode CD may be a thin metal layer having a thickness allowing light emitted from the light-emitting layer EML to transmit therethrough. The second electrode CD may allow some of the light generated from the light-emitting layer EML to pass therethrough and may reflect the rest of the light generated from the light-emitting layer EML.

The second electrode CD may include material having a work function lower than that of the transparent conductive layer. For instance, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy of them.

Some of the light emitted from the light-emitting layer EML may not transmit through the second electrode CD, and light reflected by the second electrode CD may be reflected by the reflective layer again. That is, light emitted form the light-emitting layer EML may resonate between the reflective layer and the second electrode CD. The light extraction efficiency of the OLED may be enhanced by the resonance of light.

The distance between the reflective layer and the second electrode CD may change depending on the color of light emitted from the light-emitting layer EML. That is, depending on the color of light emitted from the light-emitting layer EML, the distance between the reflective layer and the second electrode CD may be adjusted to correspond to a resonance distance.

The encapsulating layer SLM may prevent oxygen or water from permeating the OLED. The encapsulating layer SLM may include a plurality of inorganic layers (not shown) and a plurality of organic layers (not shown). For example, the encapsulating layer SLM may include a plurality of unit encapsulating layers including an inorganic layer and an organic layer disposed on the inorganic layer. An inorganic layer may be disposed in an uppermost portion of the encapsulating layer SLM. The inorganic layer may include at least one of silicon oxide, silicon nitride, silicon oxynitride, aluminum oxide, titanium oxide, zirconium oxide, and tin oxide.

Figure 7:
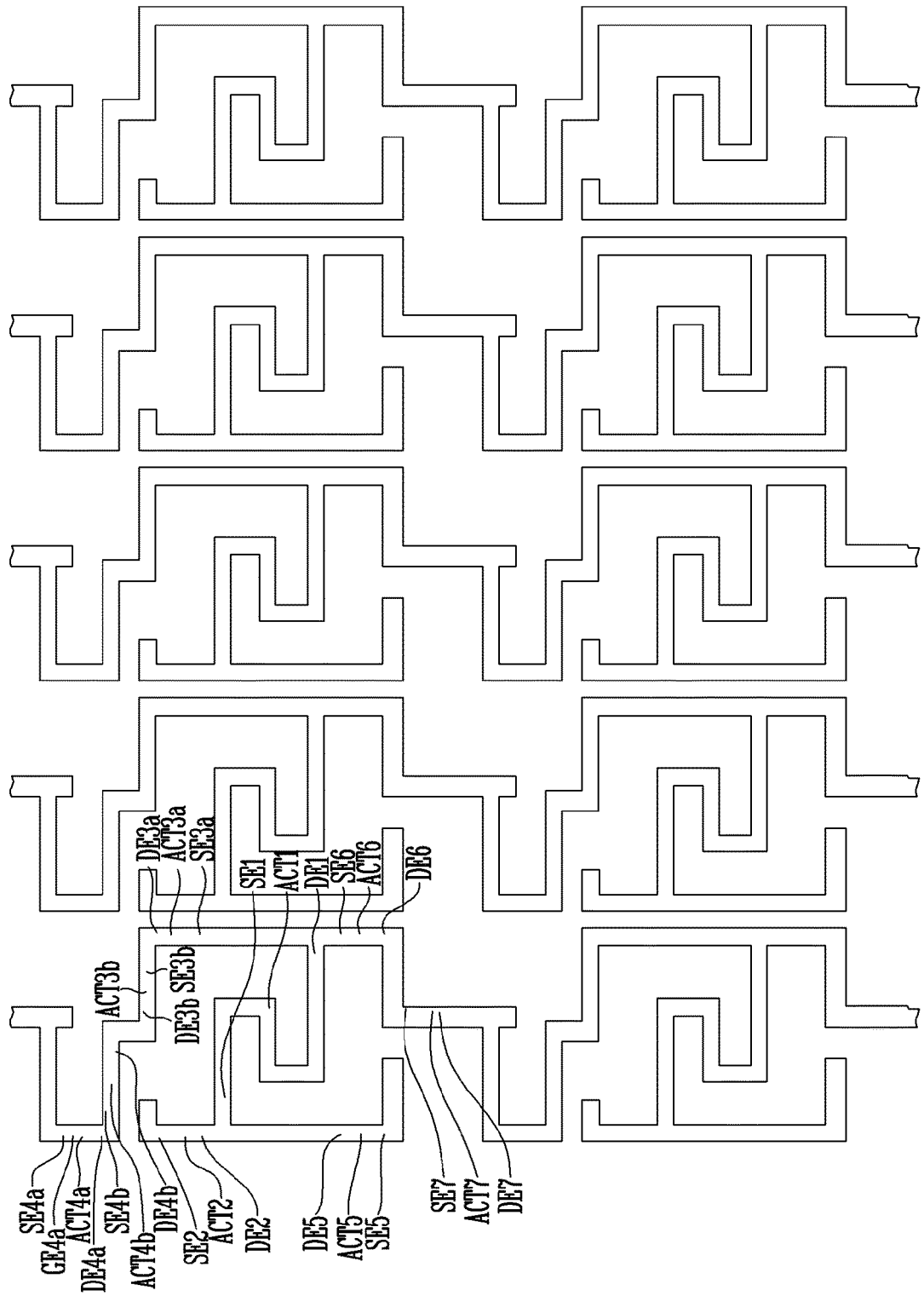
FIG. 7 is a plan view illustrating an active pattern, source electrodes, and drain electrodes shown in FIGS. 2 to 6.
Figure 8:
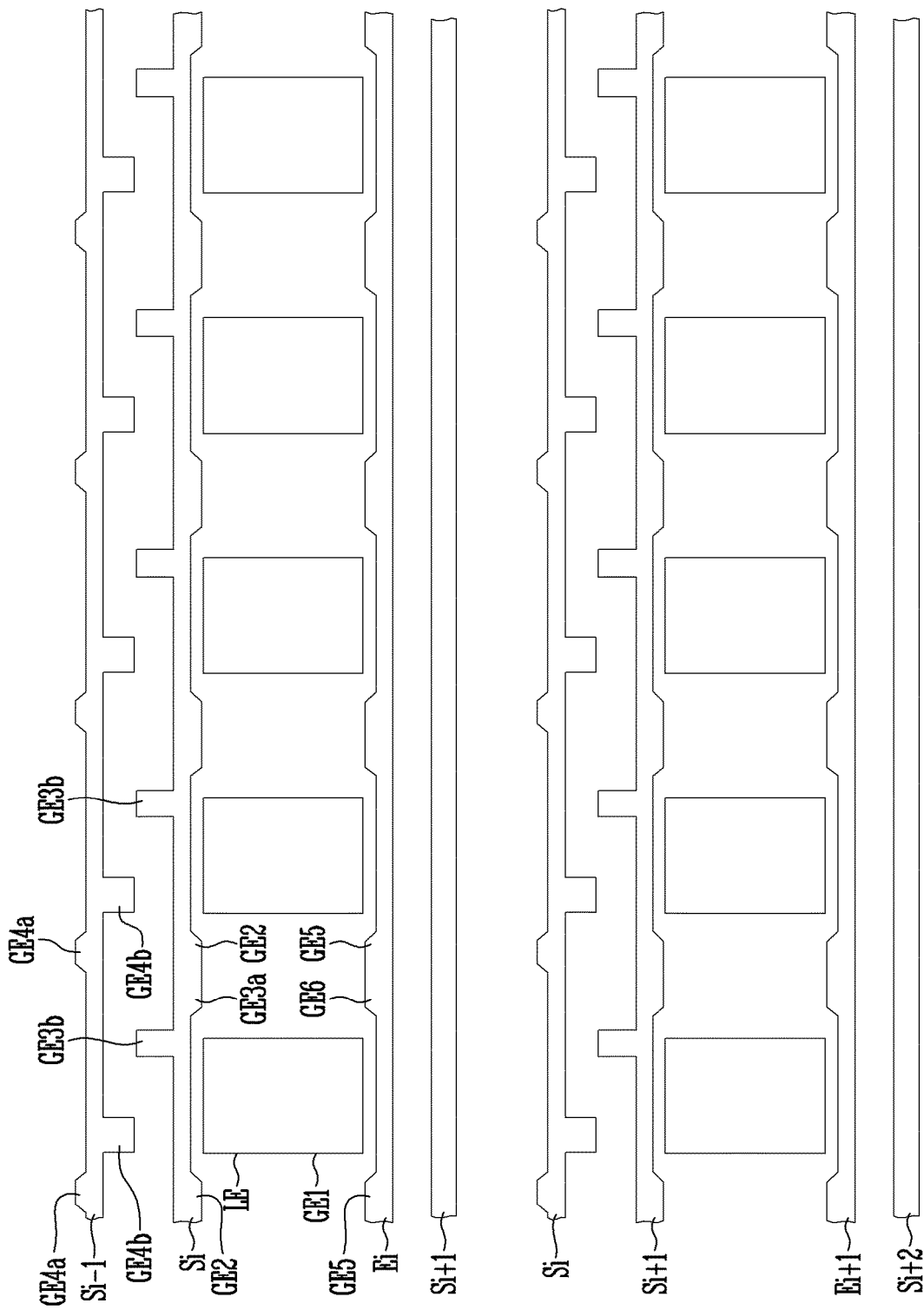
FIG. 8 is a plan view illustrating scan lines, emission control lines and a lower electrode of a storage capacitor shown in FIGS. 2 to 6.
Figure 9:
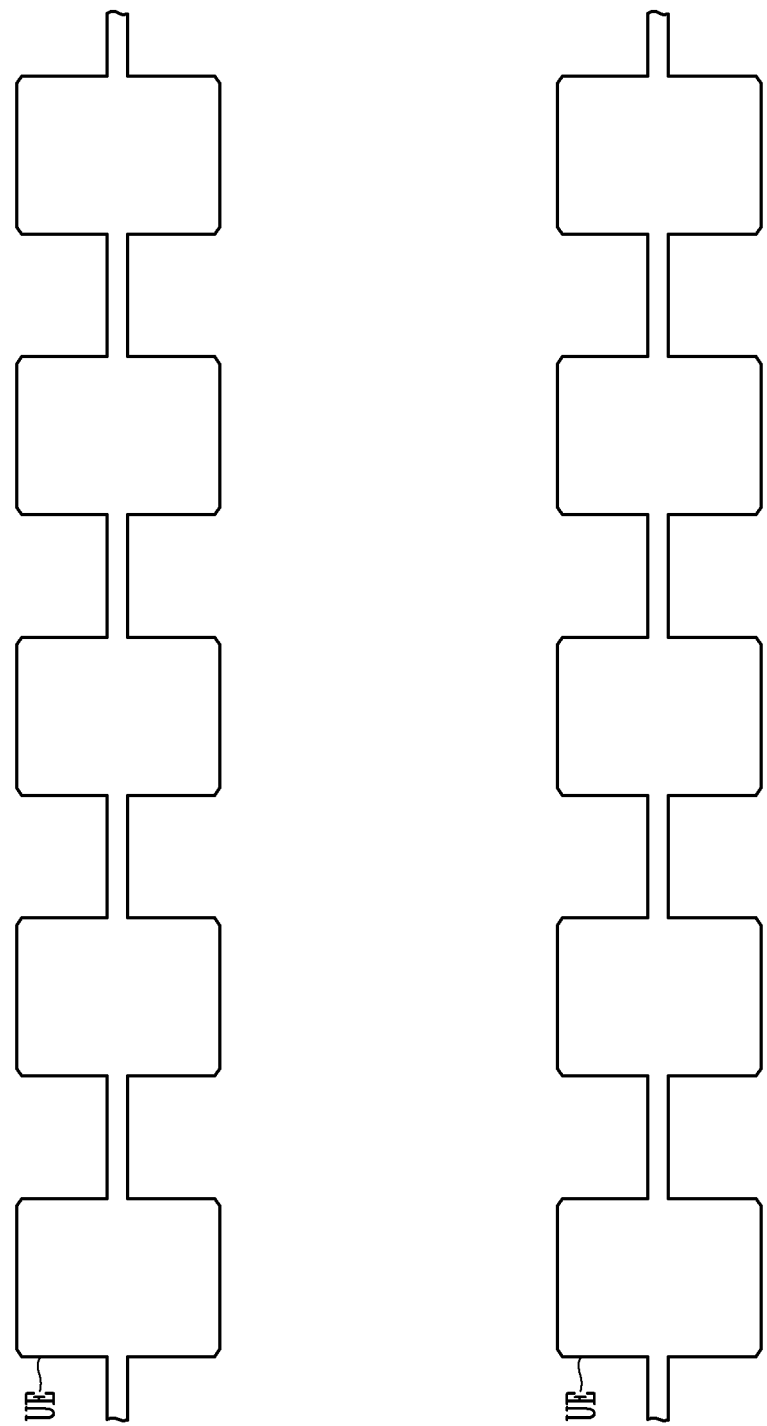
FIG. 9 is a plan view illustrating an upper electrode of the storage capacitor shown in FIGS. 2 to 6.
Figure 10:
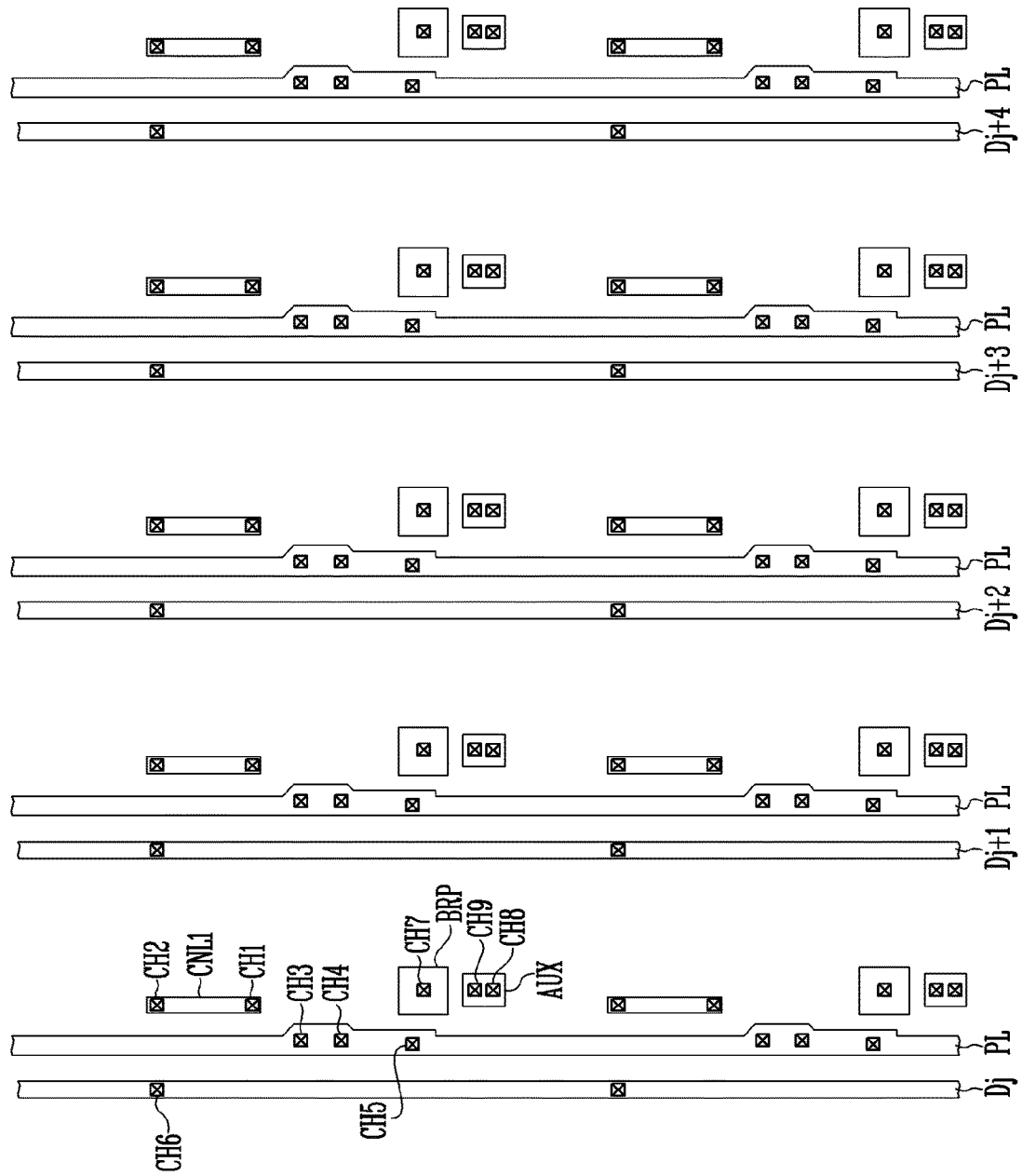
FIG. 10 is a plan view illustrating data lines, a connection line, an auxiliary connection line, a power line, and a bridge pattern shown in FIGS. 2 to 6.

FIG. 7 is a plan view illustrating the active pattern, the source electrodes, and the drain electrodes shown in FIGS. 2 to 6. FIG. 8 is a plan view illustrating the scan lines, the emission control lines and the lower electrode of the storage capacitor shown in FIGS. 2 to 6. FIG. 9 is a plan view illustrating the upper electrode of the storage capacitor shown in FIGS. 2 to 6. FIG. 10 is a plan view illustrating the data lines, the connection line, the auxiliary connection line, the power line, and the bridge pattern shown in FIGS. 2 to 6. FIGS. 11 to 14 are plan views illustrating the initialization power line and the OLED shown in FIGS. 2 to 6. For the sake of description, FIGS. 7 to 14 illustrate components of pixels on an i-th pixel row and an i+1-th pixel row by layers.

Referring to FIGS. 2 to 14, the semiconductor pattern may be provided on the substrate SUB. The semiconductor pattern may include the first to seventh active patterns ACT1 to ACT7, the first to seventh source electrodes SE1 to SE7, and the first to seventh drain electrodes DE1 to DE7. The first to seventh active patterns ACT1 to ACT7, the first to seventh source electrodes SE1 to SE7, and the first to seventh drain electrodes DE1 to DE7 may be provided on the same layer and formed through the same process. The first to seventh active patterns ACT1 to ACT7, the first to seventh source electrodes SE1 to SE7, and the first to seventh drain electrodes DE1 to DE7 may include semiconductor material.

A first end of the first active pattern ACT1 may be coupled to the first source electrode SE1, and a second end thereof may be coupled to the first drain electrode DE1. A first end of the second active pattern ACT2 may be coupled to the second source electrode SE2, and a second end thereof may be coupled to the second drain electrode DE2. A first end of the third active pattern ACT3 may be coupled to the third source electrode SE3, and the second end thereof may be coupled to the third drain electrode DE3. A first end of the fourth active pattern ACT4 may be coupled to the fourth source electrode SE4, and the second end thereof may be coupled to the fourth drain electrode DE4. A first end of the fifth active pattern ACT5 may be coupled to the fifth source electrode SE5, and the second end thereof may be coupled to the fifth drain electrode DE5. A first end of the sixth active pattern ACT6 may be coupled to the sixth source electrode SE6, and the second end thereof may be coupled to the sixth drain electrode DE6. A first end of the seventh active pattern ACT7 may be coupled to the seventh source electrode SE7, and the second end thereof may be coupled to the seventh drain electrode DE7.

Scan lines Si−1, Si, Si+1, and Si+2, emission control lines Ei and Ei+1, and the lower electrode LE of the storage capacitor Cst may be provided on the gate insulating layer GI disposed on the semiconductor pattern. The scan lines Si−1, Si, Si+1, and Si+2, the emission control lines Ei and Ei+1, and the lower electrode LE of the storage capacitor Cst may be provided on the same layer and formed through the same process.

The scan lines Si−1, Si, Si+1, and Si+2 may include an i−1-th scan line Si−1, an i-th scan line Si, an i+1-th scan line Si+1, and an i+2-th scan line Si+2.

In the i-th pixel row, the first gate electrode GE1 may be provided on the lower electrode LE. The fourth gate electrode GE4 may be provided on the i−1-th scan line Si−1. The second gate electrode GE2 and the third gate electrode GE3 may be provided on the i-th scan line Si. The seventh gate electrode GE7 may be provided on the i+1-th scan line Si+1. The fifth gate electrode GE5 and the sixth gate electrode GE6 may be provided on the emission control line Ei.

In the i+1-th pixel row, the first gate electrode GE1 may be provided on the lower electrode LE. The fourth gate electrode GE4 may be provided on the i-th scan line Si. The second gate electrode GE2 and the third gate electrode GE3 may be provided on the i+1-th scan line Si+1. The seventh gate electrode GE7 may be provided on the i+2-th scan line Si+2. The fifth gate electrode GE5 and the sixth gate electrode GE6 may be provided on the emission control line Ei+1.

The upper electrode UE of the storage capacitor may be provided on the first interlayer insulating layer IL1 disposed on the scan lines Si−1, Si, Si+1, and Si+2, the emission control lines Ei, and Ei+1, and the lower electrode LE.

Data lines Dj, Dj+1, Dj+2, Dj+3, and Dj+4, the power line PL, the auxiliary line AUX, the connection line CNL, and the bridge pattern BRP may be provided on the second interlayer insulating layer IL2 disposed on the upper electrode UE. The data lines Dj, Dj+1, Dj+2, Dj+3, and Dj+4, the power line PL, the auxiliary line AUX, the connection line CNL, and the bridge pattern BRP may be provided on the same layer and formed through the same process.

The data lines Dj, Dj+1, Dj+2, Dj+3, and Dj+4 may be coupled to the second source electrode SE2 through the sixth contact hole CH6 passing through the gate insulating layer GI, the first interlayer insulating layer IL1, and the second interlayer insulating layer IL2.

The power line PL may extend parallel to either the data lines Dj, Dj+1, Dj+2, Dj+3, and Dj+4 or the scan lines Si−1, Si, and Si+1, for example, the data lines Dj, Dj+1, Dj+2, Dj+3, and Dj+4. The power line PL may be coupled to the upper electrode UE through the third contact hole CH3 and the fourth contact hole CH4 that pass through the second interlayer insulating layer IL2. The power line PL may be coupled to the fifth source electrode SE5 through the fifth contact hole CH5 passing through the gate insulating layer GI, the first interlayer insulating layer IL1, and the second interlayer insulating layer IL2.

The connection line CNL may be coupled to the first gate electrode GE1 through the first contact hole CH1 passing through the first interlayer insulating layer IL1 and the second interlayer insulating layer IL2. The connection line CNL may be coupled to the third drain electrode DE3 and the fourth drain electrode DE4 through the second contact hole CH2.

The auxiliary connection line AUX may be coupled to the seventh drain electrode DE7 through the ninth contact hole CH9 passing through the gate insulating layer GI, the first interlayer insulating layer IL1 and the second interlayer insulating layer IL2.

The bridge pattern BRP may be coupled to the sixth drain electrode DE6 and the seventh source electrode SE7 through the seventh contact hole CH7 passing through the gate insulating layer GI, the first interlayer insulating layer IL1 and the second interlayer insulating layer IL2.

A protective layer PSV may be provided on the data lines Dj, Dj+1, Dj+2, Dj+3, and Dj+4, the power line PL, the auxiliary line AUX, the connection line CNL, and the bridge pattern BRP. The OLEDs and the initialization power line IPL may be provided on the protective layer PSV. Each of the OLEDs may include a first electrode AD provided on the protective layer PSV, a light-emitting layer EML provided on the first electrode AD, and a second electrode CD provided on the light-emitting layer EML.

The initialization power line IPL may be provided on the protective layer PSV at a position spaced apart from the first electrode AD. The initialization power line IPL may be coupled to the auxiliary connection line AUX through the eighth contact hole CH8 passing through the protective layer PSV. Therefore, the initialization power line IPL may be coupled to the seventh drain electrode DE7 by the auxiliary connection line AUX.

The initialization power supply Vint may be applied to the initialization power line IPL. The initialization power line IPL may include a plurality of first conductive lines CP1, and a plurality of second conductive lines CP2 which intersect the first conductive lines CP1 and are electrically coupled to the first conductive lines CP1. Hence, the initialization power line IPL may prevent a voltage drop of the initialization power supply Vint, unlike the case where the initialization power line IPL includes only either the first conductive lines CP1 or the second conductive lines CP2, the Furthermore, even if a line of the first and second conductive lines CP1 and CP2 short-circuits or opens at any one point, the initialization power line IPL may apply the initialization power supply Vint to an adjacent pixel PXL. Consequently, the display device may be prevented from deteriorating in display quality.

The initialization power line IPL may not overlap the first electrode AD. For example, the initialization power line IPL may bypass the first electrodes AD of OLEDs. The first conductive lines CP1 and the second conductive lines CP2 may be provided at positions spaced apart from the first electrode AD. For instance, the first conductive lines CP1 and the second conductive lines CP2 may be provided in an area between the first electrodes AD of adjacent OLEDs. Furthermore, the first conductive lines CP1 and the second conductive lines CP2 may extend in a direction oblique to at least either the data lines Dj, Dj+1, Dj+2, Dj+3, and Dj+4 or the scan lines Si−1, Si, and Si+1, for example, both the data lines Dj, Dj+1, Dj+2, Dj+3, and Dj+4 and the scan lines Si−1, Si, and Si+1.

The initialization power line IPL may further include a contact area CHR, which extend from each of points at which the first conductive lines CP1 and the second conductive lines CP2 intersect each other toward the adjacent first electrode AD, and which may be coupled to the auxiliary connection line AUX through the eighth contact hole CH8. The width of the contact area CHR may be greater than that of each of the first and second conductive lines CP1 and CP2.

The first and second conductive lines CP1 and CP2 may bypass the first electrodes AD in various shapes.

Figure 11:
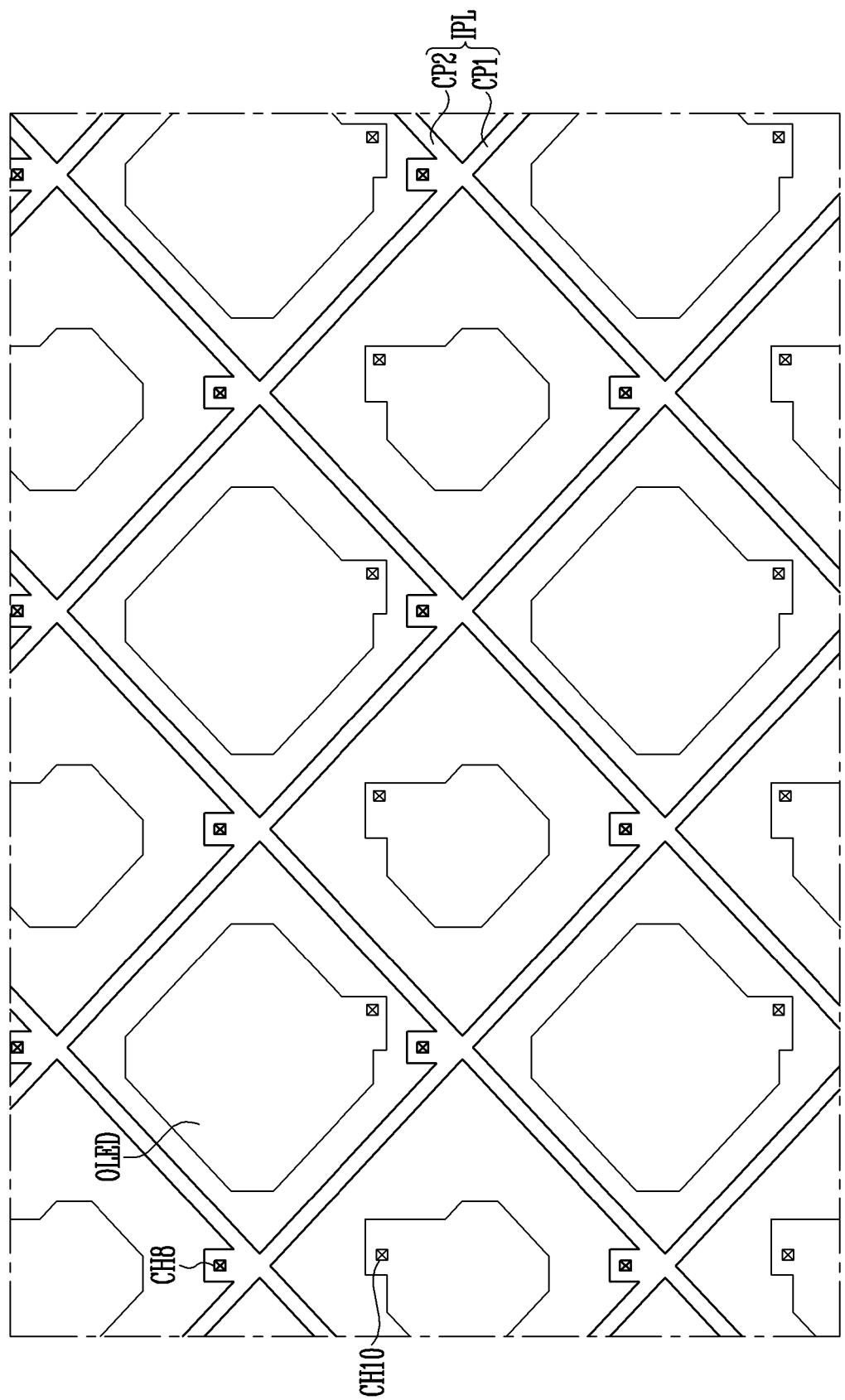
FIGS. 11, 12, 13, and 14 are plan views illustrating an initialization power line and an organic light-emitting diode shown in FIGS. 2 to 6.

For example, the first and second conductive lines CP1 and CP2 may form a shape shown in FIG. 11, in which each of the first and second conductive lines CP1 and CP2 extends in one direction and they may intersect each other. A single OLED may be disposed in each of the areas formed by intersecting the first and second conductive lines CP1 and CP2.

Figure 12:
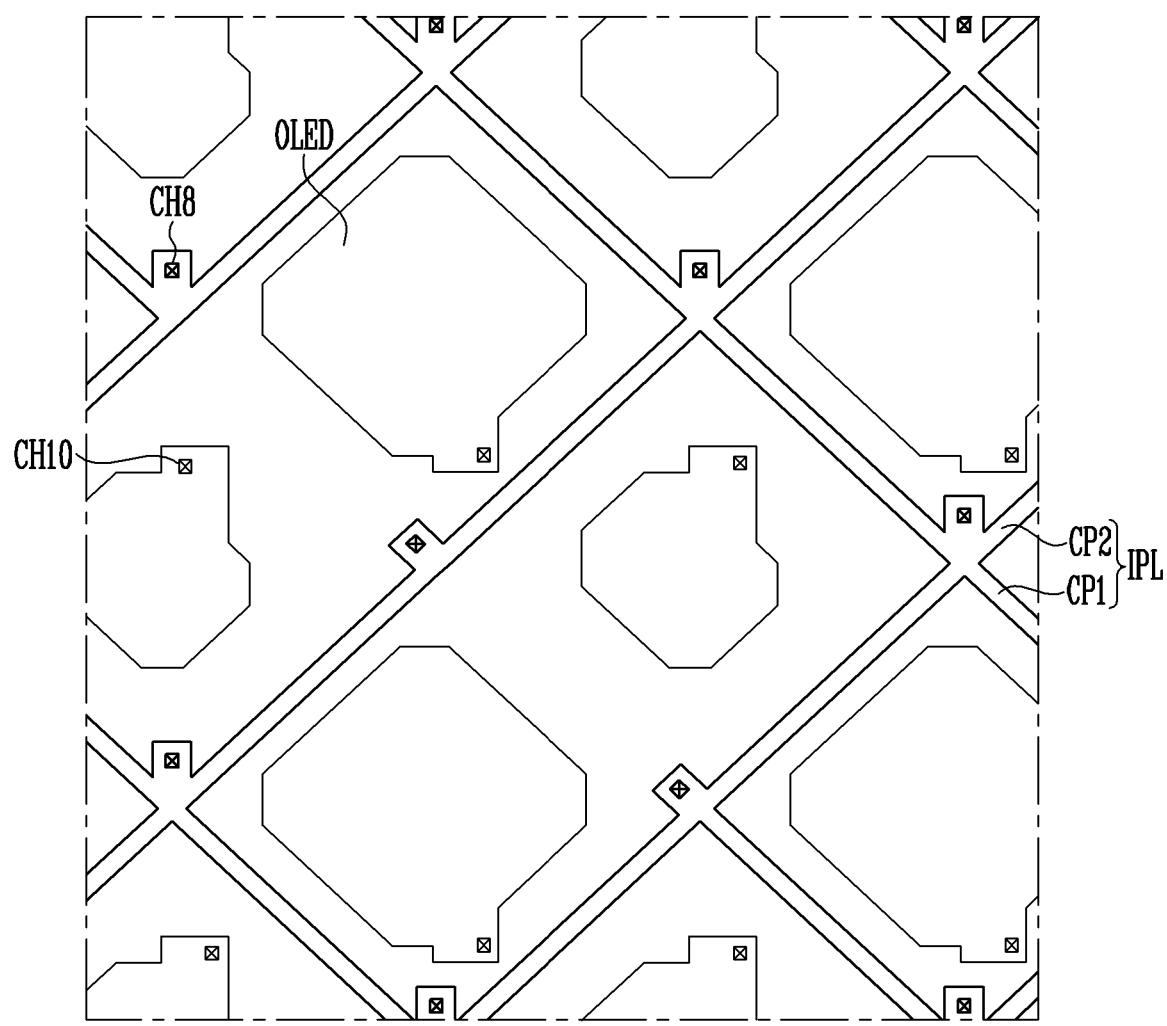

Alternatively, the first and second conductive lines CP1 and CP2 may form a shape shown in FIG. 12, in which each of the first and second conductive lines CP1 and CP2 extends in one direction and they intersect each other. In addition, portions of at least either the first conductive lines CP1 or the second conductive lines CP2, for example, portions of the first conductive lines CP1, may be removed. In this case, a plurality of OLEDs may be disposed in each of the areas formed by intersecting the first and second conductive lines CP1 and CP2. For instance, two OLEDs may be disposed in each of the areas formed by intersecting the first and second conductive lines CP1 and CP2.

Figure 13:
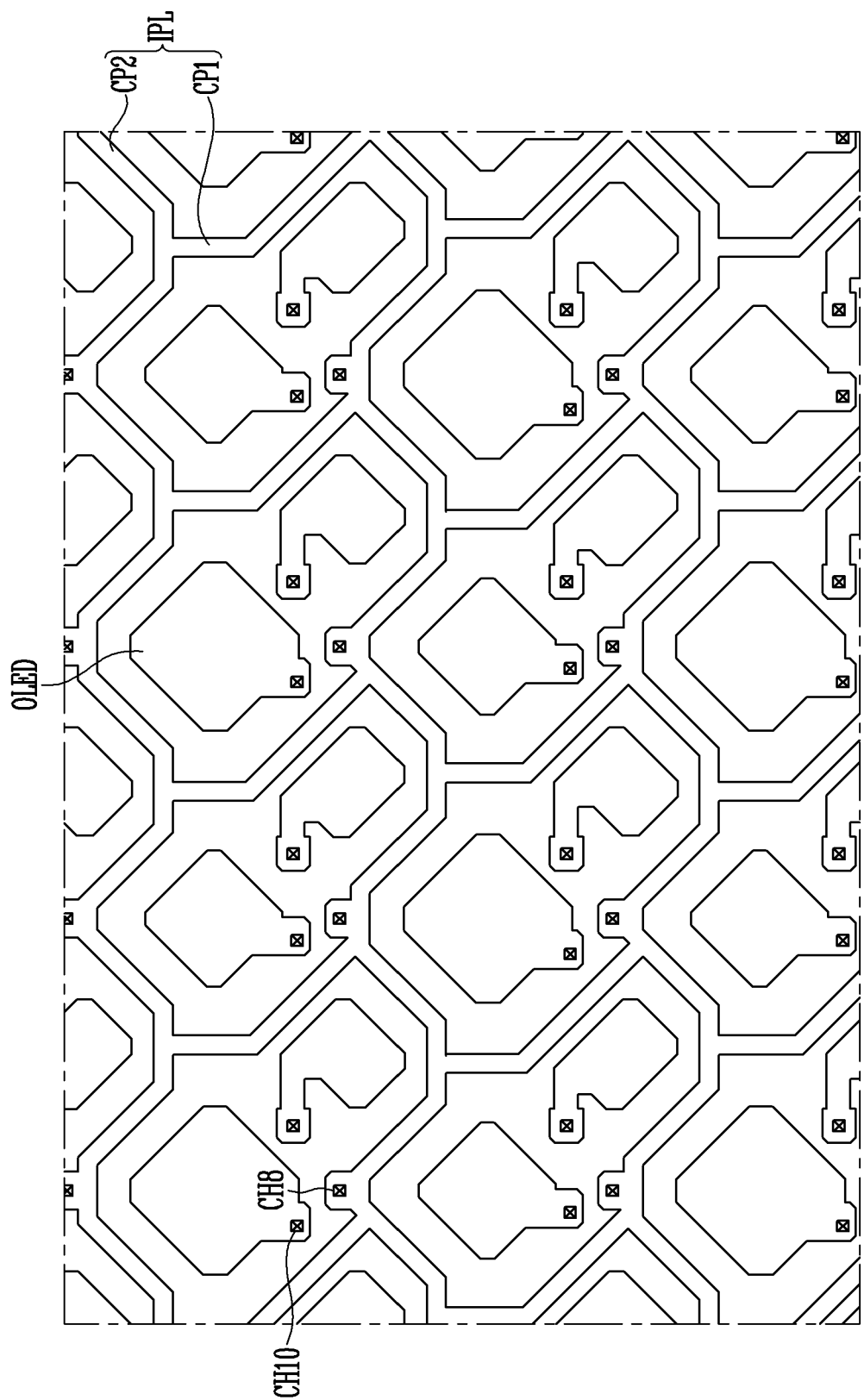

As an alternative, the first and second conductive lines CP1 and CP2 may form a shape shown in FIG. 13, in which the first and second conductive lines CP1 and CP2 intersect each other. In this case, portions of at least either the first conductive lines CP1 or the second conductive lines CP2, for example, portions of the first conductive lines CP1, may be removed. A plurality of OLEDs may be disposed in each of the areas formed by intersecting the first and second conductive lines CP1 and CP2. Portions of at least either the first conductive lines CP1 or the second conductive lines CP2 may be bent, and the bent portions may be repeatedly formed. Thereby, the first and second conductive lines CP1 and CP2 may form a shape in which they bypass the first electrodes AD while being adjacent to the first electrodes AD.

Figure 14:
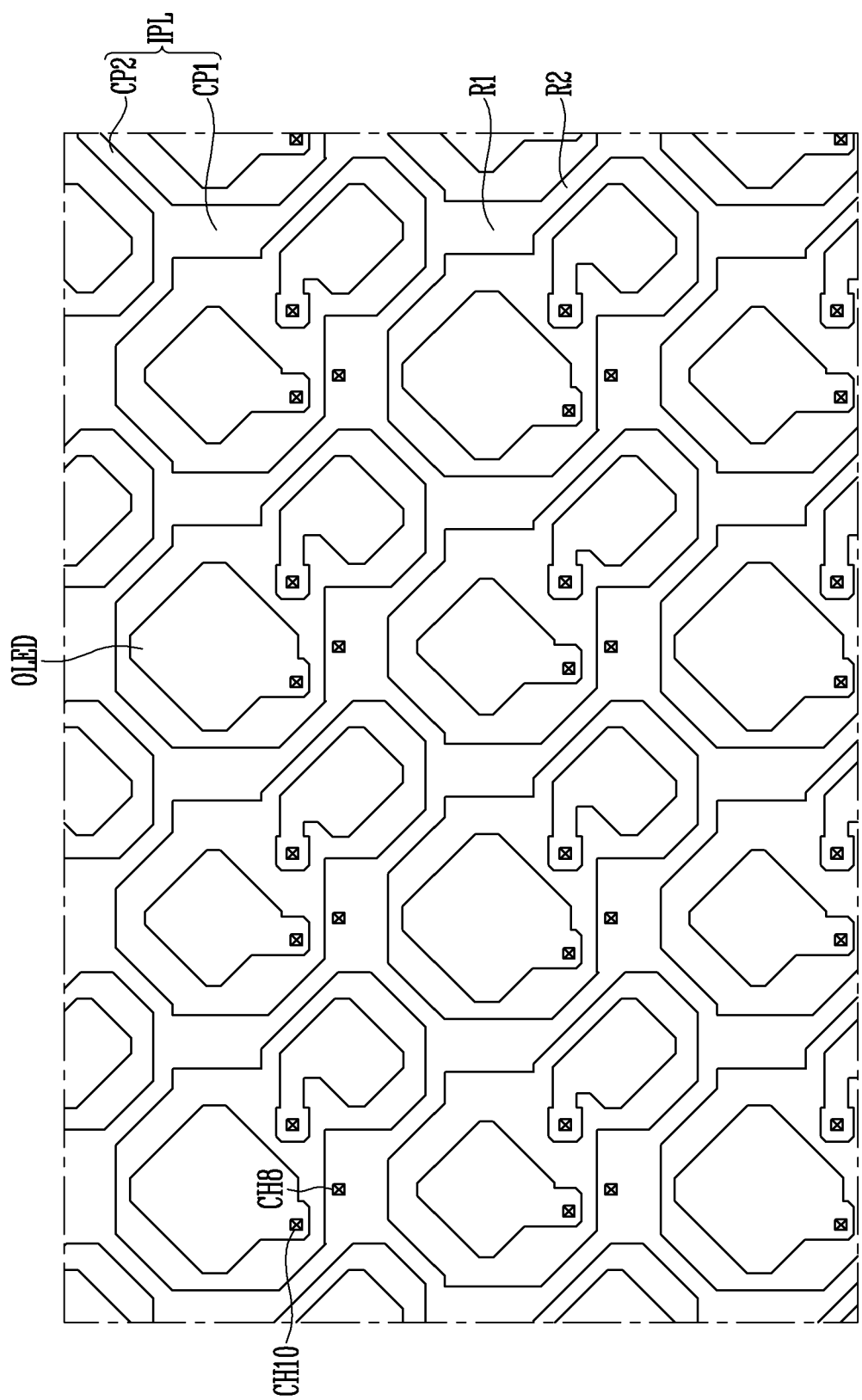

As a further alternative, the first and second conductive lines CP1 and CP2 may form a shape shown in FIG. 14, in which the first and second conductive lines CP1 and CP2 intersect each other. In this case, portions of at least either the first conductive lines CP1 or the second conductive lines CP2, for example, portions of the first conductive lines CP1, may be removed. A plurality of OLEDs may be disposed in each of the areas formed by intersecting the first and second conductive lines CP1 and CP2. Portions of at least either the first conductive lines CP1 or the second conductive lines CP2 may be bent, and the bent portions may be repeatedly formed.

The first conductive lines CP1 and the second conductive lines CP2 may include a first region R1, and a second region R2 coupled to the first region R1. The first region R1 may have a width greater than that of the second region R2. In the first and second conductive lines CP1 and CP2, the first region R1 may be parallel with either the data lines Dj, Dj+1, Dj+2, Dj+3, and Dj+4 or the scan lines Si−1, Si, Si+1, and Si+2, for example, the data lines Dj, Dj+1, Dj+2, Dj+3, and Dj+4.

In the present embodiment, although the first region R1 of the first and second conductive lines CP1 and CP2 has been illustrated as being parallel with either the data lines Dj, Dj+1, Dj+2, Dj+3, and Dj+4 or the scan lines Si−1, Si, Si+1, and Si+2, the present disclosure is not limited to this. For example, the first region R1 of the first and second conductive lines CP1 and CP2 may be oblique to either the data lines Dj, Dj+1, Dj+2, Dj+3, and Dj+4 or the scan lines Si−1, Si, Si+1, and Si+2.

In the case where the first electrode AD does not overlap the third transistor T3 or the fourth transistor T4, leakage current may be caused from the third transistor T3 or the fourth transistor T4 by external light. In the case where the first electrode AD does not overlap the third transistor T3 or the fourth transistor T4, the second region R2 may overlap the third transistor T3 or the fourth transistor T4. The second region R2 may block external light which may be incident on the third transistor T3 or the fourth transistor T4. Hence, the second region R2 may prevent leakage current of the third or fourth transistor T3 or T4 attributable to external light.

The first region R1 may apply a signal or power to the pixels PXL, and they may be disposed adjacent to each other. The first region R1 may overlap signal lines or power lines which are parallel with each other. For example, the first region R1 may overlap both one of the data lines Dj, Dj+1, Dj+2, Dj+3, and Dj+4 and the power line PL disposed to the data line. Here, the first region R1 may function as a shield electrode which prevent parasitic capacitance formed between the signal lines or power lines that are adjacent to each other.

As described above, in a display device in accordance with an exemplary embodiment, an initialization power line has a mesh structure so that a voltage drop of an initialization power supply may be prevented. Therefore, the display quality of the display device may be enhanced. Furthermore, even if portion of the initialization power line of the display device short-circuits or opens, initialization power may be applied to pixels disposed adjacent to the short-circuited or open point. Consequently, the display quality of the display device may be prevented.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   pixels on a substrate, each of the pixels including at least one transistor and a light-emitting element electrically connected to the transistor through a first contact hole passing through an insulating layer; and
   an initialization power line on the substrate, the initialization power line being configured to supply initialization power to the pixels,
   wherein:
   the light-emitting element includes a first electrode electrically connected to the transistor through the first contact hole, a light-emitting layer disposed on the first electrode, and a second electrode on the light-emitting layer;
   the initialization power line includes a first conductive line and a second conductive line intersecting the first conductive line;
   the initialization power line is electrically connected to a source electrode or a drain electrode of the transistor through a second contact hole passing through the insulating layer;
   the first conductive line and the second conductive line surround at least a portion of the first electrode such that the first conductive line and the second conductive line are spaced apart from the light-emitting element;
   the first conductive line and the second conductive line form a plurality of closed loops, each closed loop having a same size, a rhombus shape, and including one of the light-emitting elements;
   the light-emitting element included in any one closed loop has a different size than the light-emitting element included in each of the closed loops adjacent to all sides of the one closed loop; and
   the first contact hole is disposed in each of the plurality of closed loops.

2. The display device of claim 1, wherein:
   the first conductive line and the second conductive line intersect at an intersection region; and
   the second contact hole is at a side of the intersection area.

3. The display device of claim 1, further comprising:
   scan lines on the substrate, the scan lines being electrically coupled to the pixels, and
   data lines on the substrate, the data lines being electrically coupled to the pixels,
   wherein the first conductive line extends in a direction oblique to the scan lines and the data lines.

4. The display device of claim 1, wherein the initialization power line has a mesh form.

5. The display device of claim 1, wherein the first conductive line and the second conductive line bypass the first electrode of the light-emitting element of each of the pixels.

* * * * *